(12) United States Patent
Brewer et al.

(10) Patent No.: US 12,463,176 B2
(45) Date of Patent: Nov. 4, 2025

(54) REVERSABLE ATTACHMENT SYSTEM

(71) Applicant: The Boeing Company, Chicago, IL (US)

(72) Inventors: Peter D. Brewer, Westlake Village, CA (US); Yan Tang, Oak Park, CA (US); Chia-Ming Chang, Agoura Hills, CA (US); Sevag Terterian, Lake Balboa, CA (US); Charbel Abijaoude, Newbury Park, CA (US); John J. Vajo, West Hills, CA (US)

(73) Assignee: THE BOEING COMPANY, Arlington, VA (US)

( * ) Notice: Subject to any disclaimer, the term of this patent is extended or adjusted under 35 U.S.C. 154(b) by 530 days.

(21) Appl. No.: 18/145,944

(22) Filed: Dec. 23, 2022

(65) Prior Publication Data
US 2024/0213212 A1 Jun. 27, 2024

(51) Int. Cl.
*H01L 23/00* (2006.01)

(52) U.S. Cl.
CPC .............. *H01L 24/81* (2013.01); *H01L 24/11* (2013.01); *H01L 24/13* (2013.01); *H01L 2224/1308* (2013.01); *H01L 2224/13123* (2013.01); *H01L 2224/13124* (2013.01); *H01L 2224/13144* (2013.01); *H01L 2224/13147* (2013.01); *H01L 2224/13164* (2013.01); *H01L 2224/13166* (2013.01); *H01L 2224/13169* (2013.01); *H01L 2224/1317* (2013.01); *H01L 2224/13171* (2013.01); *H01L 2224/13172* (2013.01); *H01L 2224/13179* (2013.01); *H01L 2224/13181* (2013.01); *H01L 2224/81052* (2013.01); *H01L 2224/81193* (2013.01); *H01L 2224/81203* (2013.01); *H01L 2924/01003* (2013.01); *H01L 2924/01011* (2013.01); *H01L 2924/01012* (2013.01); *H01L 2924/01013* (2013.01); *H01L 2924/01021* (2013.01); *H01L 2924/01022* (2013.01); *H01L 2924/01023* (2013.01); *H01L 2924/01024* (2013.01); *H01L 2924/01029* (2013.01); *H01L 2924/01039* (2013.01); *H01L 2924/0104* (2013.01); *H01L 2924/01041* (2013.01); *H01L 2924/01046* (2013.01); *H01L 2924/01057* (2013.01); *H01L 2924/01073* (2013.01); *H01L 2924/01078* (2013.01); *H01L 2924/01079* (2013.01)

(58) Field of Classification Search
None
See application file for complete search history.

(56) References Cited

U.S. PATENT DOCUMENTS

2009/0289332 A1* 11/2009 Boussagol .......... H01L 21/2007
257/618

* cited by examiner

Primary Examiner — Fernando L Toledo
Assistant Examiner — Shawn Shaw Muslim
(74) Attorney, Agent, or Firm — MH2 Technology Law Group LLP

(57) ABSTRACT

A reversable attachment system includes an adhesion layer, an inter-substrate bond structure, a mating layer and an extension actuator. The adhesion layer is configured to attach to a first substrate. The inter-substrate bond structure is coupled to the adhesion layer. The mating layer is configured to attach to a second substrate. The extension actuator is configured to attach to the second substrate and expand in response to an absorption of a gas. The inter-substrate bond structure is configured to form an initial thermocompression bond with the mating layer in response to an applied pressure and an applied heat. The expansion of the extension actuator in response to absorbing the gas detaches the inter-substrate bond structure from the mating layer.

20 Claims, 14 Drawing Sheets

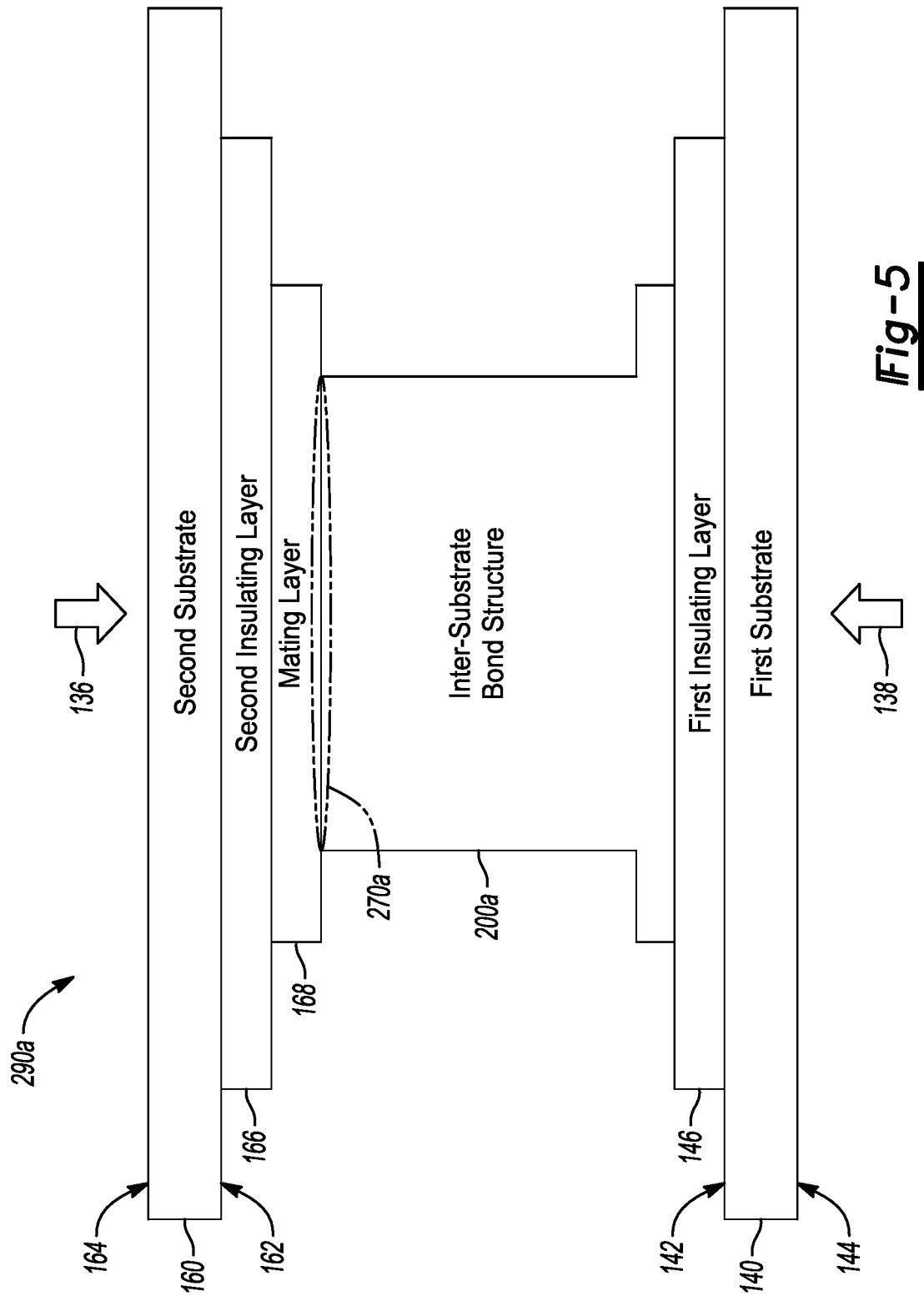

REVERSABLE ATTACHMENT SYSTEM

TECHNICAL FIELD

The disclosure relates generally to flip-chip bonding, and in particular, to a reversable attachment system.

BACKGROUND

Current computing systems involve dense integrations of a range of different elements, including processors, application specific integrated circuit accelerators, memory devices, high speed input/output devices, network processing devices, and power delivery/power management devices. Three-dimensional integration of the devices provides a performance advancement due to an increase in interconnectivity between constituent elements. The three-dimensional integration involves inter-chip thermocompression bonding. Thermocompression bonding at fine-pitch spacings often involves thermally compressing gold-covered bonding bumps at elevated temperatures and elevated pressures. Melting the gold to debond the chips involves significant heat that risks damaging the chips.

Accordingly, those skilled in the art continue with research and development efforts in the field of making inter-chip thermal bonding reworkable.

SUMMARY

A reversable attachment system is provided herein. The reversable attachment system includes an adhesion layer, an inter-substrate bond structure, a mating layer, and an extension actuator. The adhesion layer is configured to attach to a first substrate. The inter-substrate bond structure is coupled to the adhesion layer. The mating layer is configured to attach to a second substrate. The extension actuator is configured to attach to the second substrate and expand in response to an absorption of a gas. The inter-substrate bond structure is configured to form an initial thermocompression bond with the mating layer in response to an applied pressure and an applied heat. The expansion of the extension actuator in response to absorbing the gas detaches the inter-substrate bond structure from the mating layer.

In one or more embodiments of the reversable attachment system, the first substrate defines a plane, and the expansion is perpendicular to the plane.

In one or more embodiments of the reversable attachment system, the extension actuator remains responsive to the gas after exposure to one or more semiconductor processing chemicals used in fabrication of the extension actuator.

In one or more embodiments, the reversable attachment system includes a blocking chemical configured to inhibit the extension actuator from absorbing the gas.

In one or more embodiments, the reversable attachment system includes a plurality of the inter-substrate bond structures arranged in a plurality of rows, and a plurality of the extension actuators disposed between the rows.

In one or more embodiments of the reversable attachment system, the plurality of the extension actuators are configured as a plurality of bars between the rows.

In one or more embodiments of the reversable attachment system, the inter-substrate bond structure includes an outer gas-permeable layer coupled to the adhesion layer and an outer bond layer coupled to the outer gas-permeable layer. The outer gas-permeable layer is configured to expand and create a fracture in the inter-substrate bond structure in response to another absorption of the gas. The outer bond layer is configured to form the initial thermocompression bond with the mating layer on the second substrate.

In one or more embodiments of the reversable attachment system, the extension actuator comprises one of palladium, vanadium, niobium, and titanium, and the gas comprises hydrogen.

In one or more embodiments of the reversable attachment system, the first substrate comprises one of a semiconductor die, a semiconductor tile, or a semiconductor wafer.

A method for fabricating a reversable attachment system is provided herein. The method includes forming an adhesion layer on a first substrate, forming an inter-substrate bond structure on the adhesion layer, forming a mating layer on a second substrate, and forming an extension actuator on the second substrate. The extension actuator is configured to expand in response to an absorption of a gas. The inter-substrate bond structure is configured to form an initial thermocompression bond with the mating layer in response to an applied pressure and an applied heat. The expansion of the extension actuator in response to absorbing the gas detaches the inter-substrate bond structure from the mating layer.

In one or more embodiments of the method, the first substrate defines a plane, and the expansion is perpendicular to the plane.

In one or more embodiments of the method, the extension actuator remains responsive to the gas after exposure to one or more semiconductor processing chemicals used in fabrication of the extension actuator.

In one or more embodiments, the method includes inhibiting the extension actuator from absorbing the gas with a blocking chemical.

In one or more embodiments, the method includes forming a plurality of the inter-substrate bond structures arranged in a plurality of rows, and forming a plurality of the extension actuators between the rows.

In one or more embodiments of the method, the plurality of the extension actuators are configured as a plurality of bars between the rows.

In one or more embodiments, the method includes forming an outer gas-permeable layer of the inter-substrate bond structure, and forming an outer bond layer of the inter-substrate bond structure. The outer gas-permeable layer is coupled to the adhesion layer, and the outer gas-permeable layer is configured to expand and create a fracture in the inter-substrate bond structure in response to another absorption of the gas. The outer bond layer is coupled to the outer gas-permeable layer, and the outer bond layer is configured to form the initial thermocompression bond with the mating layer on the second substrate.

In one or more embodiments of the method, the extension actuator comprises one of palladium, vanadium, niobium, and titanium, and the gas comprises hydrogen.

A method of reworking an inter-substrate thermocompression bond is provided herein. The method includes forming an adhesion layer on a first substrate, forming an inter-substrate bond structure on the adhesion layer, forming a mating layer on a second substrate, and forming an extension actuator on the second substrate. The extension actuator is configured to expand in response to an absorption of a gas. The method further includes forming an initial thermocompression bond between the inter-substrate bond structure on the first substrate and the mating layer on the second substrate in response to an applied pressure and an applied heat, and exposing the extension actuator to the gas. The expansion of the extension actuator in response to absorbing the gas detaches the inter-substrate bond structure from the mating layer. The method includes separating the first substrate from the second substrate.

In one or more embodiments, the method includes removing the gas from the extension actuator. The extension actuator returns to an original size in response to the removing of the gas. The method further includes forming another thermocompression bond between the inter-substrate bond structure on the first substrate and the mating layer on the second substrate in response to an additional applied pressure and an additional applied heat.

In one or more embodiments, the method includes forming another thermocompression bond between another inter-substrate bond structure on a third substrate and the mating layer on the second substrate in response to an additional applied pressure and an additional applied heat.

The above features and advantages, and other features and advantages of the present disclosure are readily apparent from the following detailed description of the best modes for carrying out the disclosure when taken in connection with the accompanying drawings.

BRIEF DESCRIPTION OF THE DRAWINGS

FIG. 5 is a schematic side diagram of a first bonded part in accordance with one or more exemplary embodiments.

DETAILED DESCRIPTION

Embodiments of the present disclosure include a system and a method for reworkable inter-substrate thermocompression bonding. A technique is provided to release thermocompression bonds without heating the chips up to a melting point of a bond metal. A layered bump bond structure for thermocompression-bonding interconnects containing a gas-permeable layer adjoining a gas gateway layer located between two thermocompression-bond-metal layers. An outer thermocompression-bond-metal layer provides an initial thermocompression bond. After the initial thermocompression bonding, a gas may be used to perform a debonding technique. During exposure to the gas, the gateway layer allows the gas to enter the gas-permeable layer. The gas-permeable layer subsequently hydrogenates and expands. The expansion causes fractures that result in the debonding. The residual layers above the inner thermocompression-bond-metal layer are removed and the bump bond structure is ready to form a second thermocompression bond. The technique leverages fine-pitch bonding approaches with some modifications that allow "reversible attachment" for temporary assembly and/or probing applications while providing a permanent option if the "reversible attachment" remains untriggered. The technique targets the layers underlying the outer bonding layer in an electrical contact stack-up by incorporating the gateway layer and the "detachment" gas-permeable layer. The gas-permeable layer is triggerable by exposure to the gas at temperatures as low as room temperature.

Figure 1:
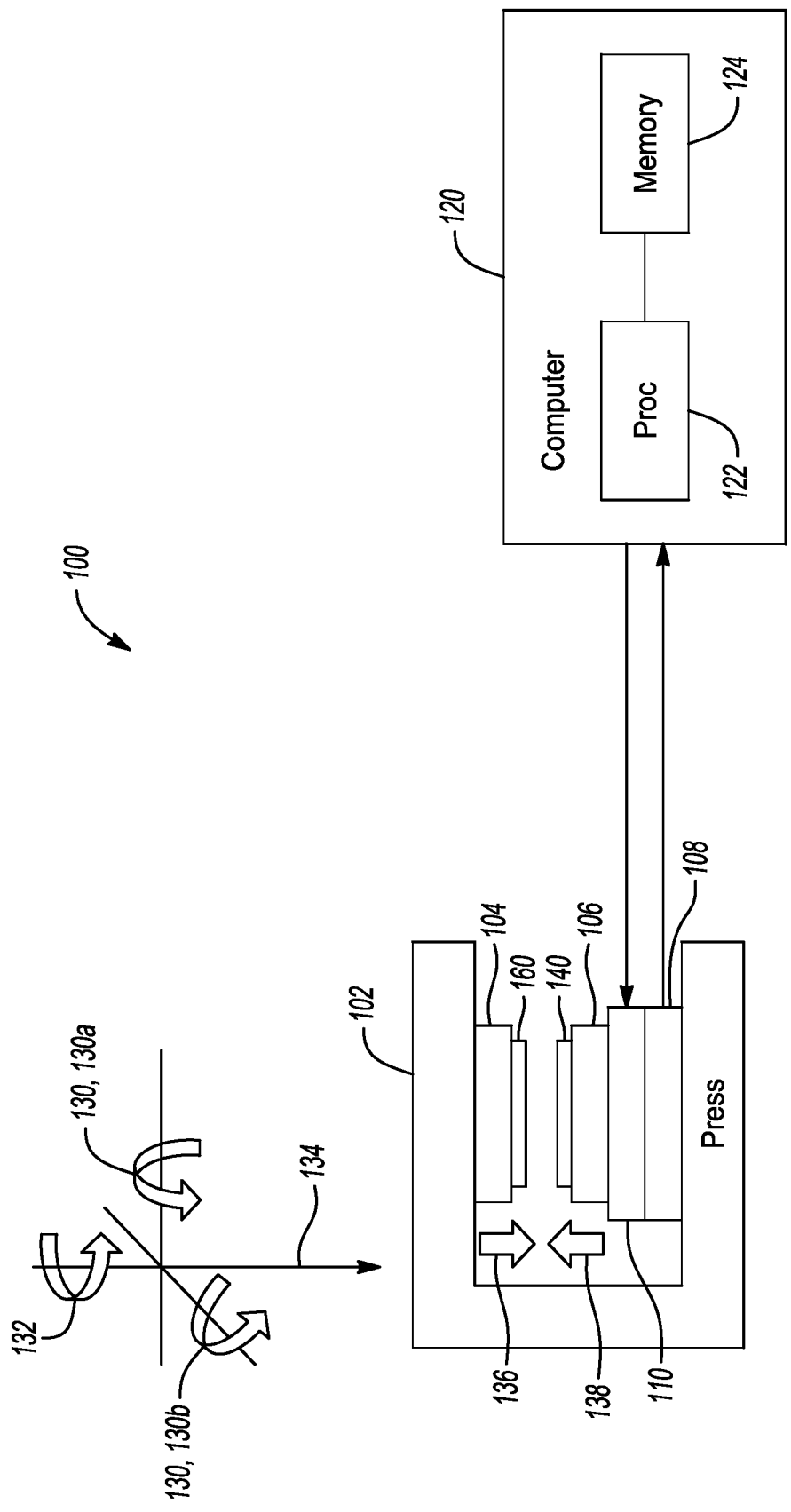
FIG. 1 is a schematic diagram of a compression system in accordance with one or more exemplary embodiments.

Referring to FIG. 1, a schematic diagram of an example implementation of a compression system 100 is shown in accordance with one or more exemplary embodiments. The compression system 100 generally includes a press 102 and a computer 120. The press 102 includes a top chuck 104, a bottom chuck 106, a load cell 108, and a heater 110. The computer 120 includes one or more processors 122 (one shown) and one or more memory devices 124 (one shown).

The press 102 implements a precision die bonder. In various embodiments, the press 102 implements a substrate-to-substrate thermocompression press. The press 102 is operational to align and press two substrates together to form inter-substrate connections. The alignment may be provided by movement of the top chuck 104 relative to the bottom chuck 106 in multiple dimensions. By way of example, the top chuck 104 may tilt 130 relative to the bottom chuck 106. The tilt 130 may include movement in a pitch direction 130a and a roll direction 130b. In some embodiments, the bottom chuck 106 may be rotatable relative to the top chuck 104 in a yaw direction 132. In other embodiments, the top chuck 104 may be rotatable relative to the bottom chuck 106 in the yaw direction 132. The top chuck 104 is also moveable relative to the bottom chuck 106 in a vertical direction 134.

Movement of the top chuck 104 downward along the vertical direction 134 presses a first substrate 140 being held by the bottom chuck 106 against a second substrate 160 being held by the top chuck 104 with an applied pressure 136 (or force). The applied pressure 136 compresses inter-substrate bond structures on the first substrate 140 into corresponding pads on the second substrate 160. In some embodiments, the first substrate 140 may be held by the top chuck 104 and the second substrate 160 may be held by the bottom chuck 106. The load cell 108 measures the applied pressure 136 being applied between the first substrate 140 and the second substrate 160.

The top chuck 104 and the bottom chuck 106 each implement a vacuum chuck. The top chuck 104 and the bottom chuck 106 are operational to hold the second substrate 160 and the first substrate 140 during the bonding process.

The load cell 108 implements a pressure sensor. The load cell 108 is operational to detect the applied pressure 136 applied by the second substrate 160 onto the first substrate 140 during a calibration test of the press 102.

The heater 110 implements a variable heat source controlled by the computer 120. The heater 110 is operational to heat the first substrate 140 and the second substrate 160 to one or more temperatures determined by the computer 120. During a thermocompression bonding process, the heater 110 raises the temperature of the first substrate 140 and the second substrate 160 to a bonding temperature appropriate for bonding the materials used in inter-substrate bump bonds. During a debonding process, the heater 110 raises the temperature of the first substrate 140 and the second substrate 160 to a diffusion temperature suitable for a gas to diffuse into the bump bonds to cause and expansion and fracture of one or more layers within the bump bonds.

The computer 120 is coupled to the heater 110 and the load cell 108. The computer 120 implements one or more data processing computers. In embodiments with multiple computers 120, the individual computers 120 are coupled together to share data, memory space, and processing resources. The computer 120 may be operational to store the configuration data of the press 102 and execute software used to control the heater 110 and analyze the information received from the load cell 108.

The processor 122 implements one or more processors within the computer 120. The processor 122 is in communication with the memory device 124 to exchange commands and data. The processor 122 is operational to execute the software tools used to analyze the data generated by the load cell 108.

The memory device 124 implements one or more non-transitory computer readable storage devices (e.g., random access memory, read-only memory, magnetic hard drives, solid-state drives, etc.). The memory device 124 stores software programs (or tools) that are executed by the processor 122.

The thermocompression bonding process applied to the inter-substrate bond structures may be similar to conventional bump bond structure bonding processes. For example, thermocompression bonding may be performed at approximately 200 degrees Celsius (° C.) for gold and approximately 300° C. for copper and aluminum while under pressure (e.g., >40 megapascals (MPa) of bond metal area).

Figure 2:
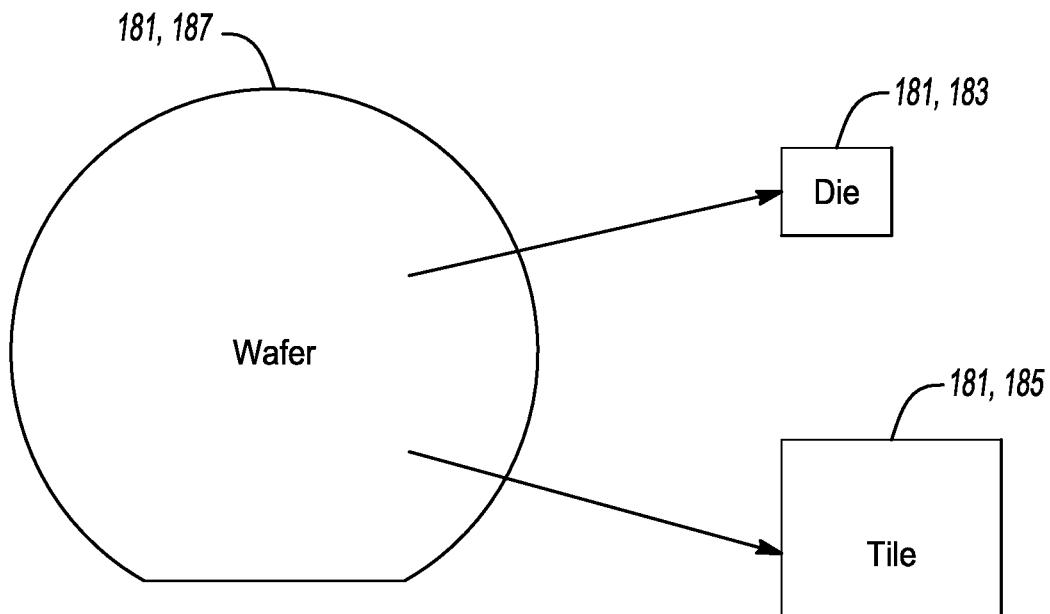
FIG. 2 is a schematic plan diagram of various substrates in accordance with one or more exemplary embodiments.

Referring to FIG. 2, a schematic plan diagram of example implementations of various substrates are shown in accordance with one or more exemplary embodiments. The substrate may be formed of a semiconductor 181. The semiconductor 181 generally includes silicon, germanium, gallium arsenide, aluminum gallium arsenide, silicon carbide, gallium nitride, indium phosphide and the like. The substrates may be in the form of a semiconductor die 183, a semiconductor tile 185, or a semiconductor wafer 187.

Figure 3:
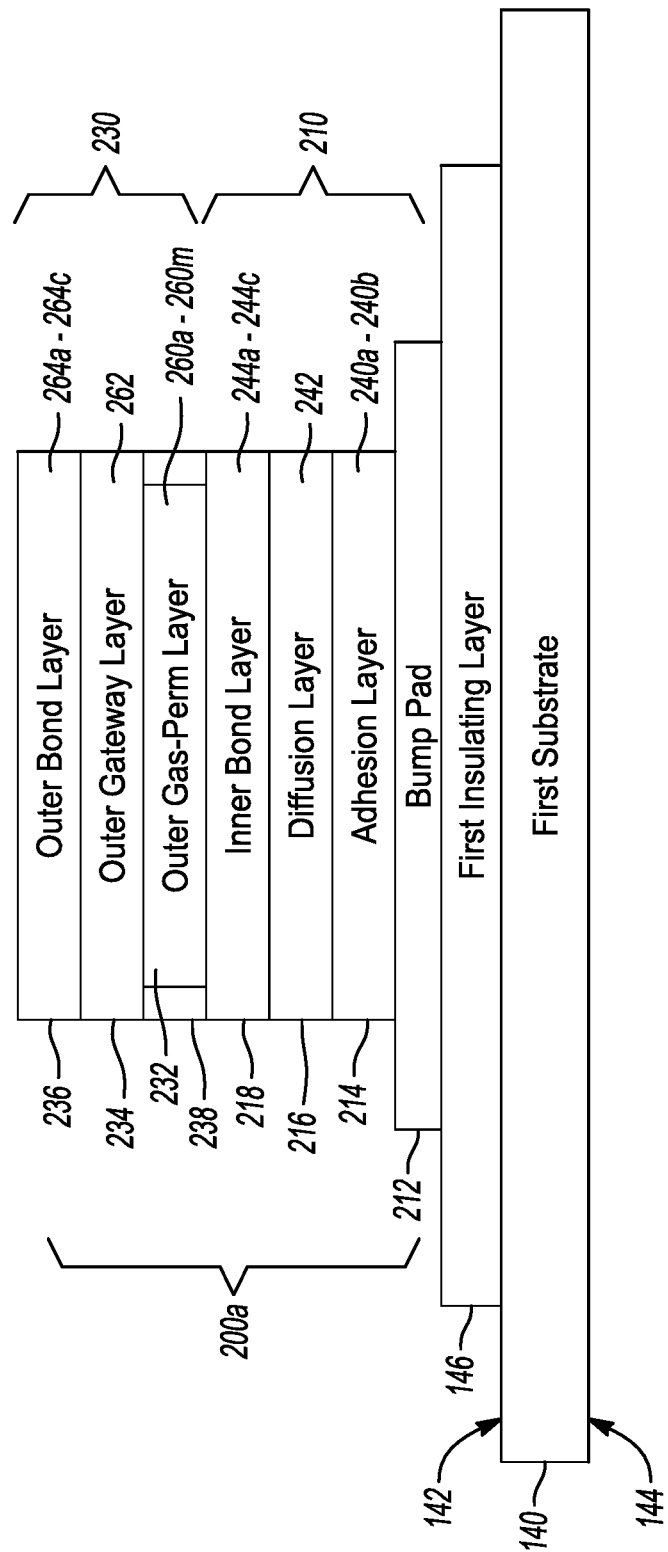
FIG. 3 is a schematic side diagram of an inter-substrate bond structure with two sets of bond layers in accordance with one or more exemplary embodiments.

Referring to FIG. 3, a schematic side diagram of an example implementation of an inter-substrate bond structure with two sets of bond layers is shown in accordance with one or more exemplary embodiments. The inter-substrate bond structure 200a illustrates a reversible contact that may be used twice. The inter-substrate bond structure 200a is formed on the first substrate 140. The first substrate 140 has a first side 142 and a third side 144 opposite the first side 142. A first insulating layer 146 may be formed on the first side 142 of the first substrate 140.

The inter-substrate bond structure 200a may be fabricated on the first insulating layer 146. The inter-substrate bond structure 200a includes an inner structure 210 and an outer structure 230. The inner structure 210 includes a bump pad 212, an adhesion layer 214, a diffusion layer 216, and an inner bond layer 218. The outer structure 230 includes an outer gas-permeable layer 232, an outer gateway layer 234, and an outer bond layer 236. An outer oxide coating 238 may be formed on an exterior surface of the outer gas-permeable layer 232.

The bump pad 212 implements a bonding pad that provides mechanical and electrical connections to the inter-substrate bond structure 200a. The bump pad 212 is operational to pass signals and/or power between circuitry (not shown) on the first substrate 140 and the second substrate 160. The bump pad 212 is generally formed of aluminum, gold, or copper. Other conductive metal layers may be used for the bump pad 212 to meet the design criteria of a particular application.

The adhesion layer 214 provides a metallurgical interface between the bump pad 212 and the rest of the inter-substrate bond structure 200a. In various embodiments, the adhesion layer 214 may be formed of titanium 240a or chromium 240b. Other metal layers may be implemented to meet the design criteria of a particular application.

The diffusion layer 216 provides a barrier between the adhesion layer 214 and the inner bond layer 218 that stops migration of metal atoms. The diffusion layer 216 is generally formed of platinum 242. Other metal layers may be implemented to meet the design criteria of a particular application.

The inner bond layer 218 provides a thermocompression-bond-metal layer formed on the diffusion layer 216. The inner bond layer 218 is a metal suitable for thermocompression bonding to another thermocompression-bond-metal layer on the second substrate 160. The metal may be formed of gold 244a, copper 244b, or aluminum 244c. Other metal layers may be implemented to meet the design criteria of a particular application.

The outer gas-permeable layer 232 provides a fracturable layer formed on the inner bond layer 218. The outer gas-permeable layer 232 is used to debond the first substrate 140 from the second substrate 160. A characteristic of the outer gas-permeable layer 232 allows for the absorption of a particular gas or gasses. The gas causes the outer gas-permeable layer 232 to expand. The expansion causes the outer gas-permeable layer 232 to fracture (or split) allowing for the debonding to occur. In various embodiments, the outer gas-permeable layer 232 is formed of titanium 260a, titanium alloy 260b, vanadium 260c, niobium 260d, palladium 260e, tantalum 260f, lanthanum 260g, yttrium 260h, zirconium 260i, scandium 260j, lithium 260k, sodium 260l, magnesium 260m, and/or alloys thereof. Other materials and/or alloys may be implemented to meet the design criteria of a particular application.

The outer gateway layer 234 provides a path for the gas to enter the outer gas-permeable layer 232 through a surface of the outer gas-permeable layer 232 normal to an axis of the inter-substrate bond structure 200a. In some embodiments, the outer gateway layer 234 may be formed of palladium 262.

The outer bond layer 236 provides another thermocompression-bond-metal layer formed on the outer gateway layer 234. The outer bond layer 236 is suitable for thermocompression bonding to another thermocompression-bond-metal layer on the second substrate 160. The outer bond layer 236 may be formed of gold 264a, copper 264b, or aluminum 264c. Other metal layers may be implemented to meet the design criteria of a particular application.

The outer oxide coating 238 may be a surface oxide formed around the outer gas-permeable layer 232. The outer oxide coating 238 generally inhibits the absorption of the particular gas that causes the fracturing to enter the outer gas-permeable layer 232 through the sidewalls of the outer gas-permeable layer 232. In the absence of the outer oxide coating 238, the outer gateway layer 234 may be made thinner or eliminated.

The gas may be hydrogen or other similar gas capable of being absorbed into the outer gas-permeable layer 232 to cause the fracturing. In various embodiments, the hydrogenation gas transforms the titanium metal of the gas-permeable layer 232 into a titanium hydride ($TiH_2$). The expansion that accompanies the hydrogenation causes the fracturing. The hydrogen gas may enter the titanium structure through the palladium of the outer gateway layer 234 that provides a hydrogen path to the titanium and serves as a secondary hydrogenation layer.

The inter-substrate bond structure 200a splits what would normally be a single bond layer into two bond layers, the outer bond layer 236 and the inner bond layer 218, separated by the outer gateway layer 234 and the outer gas-permeable layer 232. An initial thermocompression bond may be provided by outer bond layer 236. When appropriate, the outer gas-permeable layer 232 may be fractured, the inter-substrate bond structure 200a reconditioned, and the inner bond layer 218 may be used again in a second thermocompression bond. Thus, an inclusion of the titanium/palladium bilayers between the two bond-metal layers in the inter-substrate bond structure 200a and exposing the bonded structure to the hydrogen gas enables debonding of the initial thermal compressive bond.

In semiconductor wafer fabrication, the layered inter-substrate bond structure 200a and the debonding process that uses hydrogen gas under pressure to debond the second substrate 160 the first substrate 140, enables reversible substrate attachment. The outer gas-permeable layer 232 utilizes a lattice expansion and a chemical change in the metals/alloys while exposed to the hydrogen gas. Palladium is useful in the outer gateway layer 234 because palladium does not readily oxidize. In the absence of an oxide, the hydrogen gas may be absorbed (e.g., physically-absorb and/or chemically-absorbed) and passed to outer gas-permeable layer 232. Titanium that has absorbed hydrogen gas gets brittle and physically cracks. In some situations, approximately 5 atmospheres to 10 atmospheres of the hydrogen gas is sufficient to cause the cracking.

In various embodiments, the interfaces between the expanding layer and adjacent layers, like gold, may be cracked by the expansion. Modeling shows that if the expansion develops enough stress, the stress would be larger than the ultimate strength of the neighboring layers. So in the outer structure 230, with a gold layer, a palladium layer, and a titanium layer, a chemical force that causes the expansion also cracks what is generally thought to be a permanent bond between the layers. After the cracks and/or fractures have formed, the inner structure 210 may be cleaned making the inner bond layer 218 suitable to be rebonded.

Titanium metal undergoes an extensive reaction with hydrogen, including the formation of a stoichiometric $TiH_2$ phase. The $TiH_2$ phase is thermodynamically stable and therefore, near room temperature forms at low hydrogen pressures (<10-6 atmospheres $H_2$). Thus, $TiH_2$ is thermodynamically the predominate phase for titanium in one atmosphere of hydrogen 84 at room temperature.

In addition to forming a stable hydride phase, the diffusion coefficient of hydrogen 84 in titanium is relatively high, estimated to be >106 $cm^2$/second at room temperature. The diffusion coefficient enables diffusion of hydrogen over distances of 1 micrometer (um) in less than 1 second. Thus, hydrogen diffuses quickly throughout the titanium layer (<0.5 um thick) kinetically facilitating formation of the $TiH_2$.

Due to the stoichiometric composition of $TiH_2$ (i.e., 67 atomic percent hydrogen), formation of $TiH_2$ occurs with considerable expansion of the titanium atomic lattice. Given the densities and molecular weights of titanium (4.5 g/centimeters $(cm)^3$, 47.9 g/mol) and $TiH_2$ (3.9 $g/cm^3$, 49.9 g/mol), and the gram-equivalent $6.02\times10^{23}$ $mol^{-1}$ (Avogadro's number), an atomic volume of titanium is $1.77\times10^{-23}$ $cm^3$/titanium-atom in titanium metal, and $2.12\times10^{-23}$ $cm^3$/titanium-atom in $TiH_2$. Thus, formation of $TiH_2$ from titanium metal involves an expansion of the titanium atomic volume by approximately 20% and, therefore, an expansion of the titanium atom (linear) spacing by approximately 6% (e.g., 1.21/3). Formation of $TiH_2$ also changes the titanium layer from a malleable condition to a brittle condition and reduces an electrical conductivity relative to Ti. Thus, the expansion upon hydride formation and transition from malleable to brittle, together with the titanium layer initially being laterally confined by the inner bond layer 218 below and the outer gateway layer 234 above, causes cracking (transforming) in a $Ti/TiH_2$ layer at the titanium/metal bond interface, and at the titanium/palladium layer interface. The cracking enables the bonded substrates to be separated.

Although having a stable hydride phase facilitates hydride formation and fracture of the titanium in the outer gas-permeable layer 232, hydrogen typically does not enter the titanium through the exposed edges of the titanium layer because of the native outer oxide coating 238 on the surface of titanium acts as a diffusion barrier. (The native oxide layer also gives the titanium a high resistance to corrosion). Therefore, the palladium in the outer gateway layer 234 provides a gateway for hydrogen gas to enter the titanium. Unlike titanium, the palladium has a relatively unstable surface oxide that is readily permeable to (or electrochemically reduced by) hydrogen. The permeability enables gaseous hydrogen ($H_2$) to dissociate into atomic hydrogen on the palladium surface at the exposed edges of the outer gateway layer 234 and for the atomic hydrogen to diffuse into the outer gateway layer 234.

Palladium also has a relatively high diffusion coefficient for hydrogen and thus the hydrogen diffuses throughout the palladium layer. At the palladium/titanium interface, hydrogen atoms may diffuse from the palladium layer into the titanium layer because the palladium/titanium atomic interface, formed by immediately sequential deposition of the palladium over the titanium, does not contain a blocking oxide. Palladium also forms a hydride at relatively low pressures of approximately 1 bar at room temperature. The palladium hydride has a composition of approximately $PdH_{0.66}$. Because of the relatively low H/Pd ratio, palladium hydride retains the metallic character of palladium metal, although with increased electrical resistance.

Formation of palladium hydride is also accompanied by an increase in the palladium atomic volume, with an increased lattice parameter of approximately 3.3%. The expansion strains the palladium layer yet may not lead to fracture within the layer due to plastic deformation of the metallic hydride phase. However, the interfaces with the underlying titanium layer and the overlying metal-bond layer may fracture due to the expansion induced stresses. Due to the moderate stability of palladium hydride, the hydride may be decomposed (dehydrogenated) back to palladium metal by removing the hydrogen pressure. The reversibility at room temperature enables cycles of palladium metal to palladium hydride and back to palladium metal that may facilitate interfacial fractures. Although chosen as a gateway for hydrogen, some instances the gateway function of the palladium layer may be disabled (or poisoned) to prevent unintentional or unwanted debonding and/or to ensure long-term stable bonding. The exposed edges of the palladium layer may be poisoned by forming a sulfide layer on the palladium surface. The sulfide layer is formed by exposure to sulfur sources, such as sulfur vapor ($S_8$), hydrogen sulfide ($H_2S$), and/or organic thiols (e.g., R-SH, where R is an alkyl group). Selenium or tellurium may also be used to block the hydrogen diffusion.

Lateral dimensions of the inter-substrate bond structures may be similar to the dimensions used in conventional bond pad structures. For example, a 5 um×5 um fine-pitch (10 um) array may be implemented for the inter-substrate bonding. Thicknesses of the adhesion layer 214, the diffusion layer 216, the inner bond layer 218, and the outer bond layer 236 may be similar to those in conventional bond pad structures. A thickness of the outer gas-permeable layer 232 may be a suitable thickness that upon exposure to an appropriate pressure of hydrogen results in fracturing sufficient to debond. The thicknesses of the outer gas-permeable layer 232 are generally in a range of approximately 5 nanometers (nm) to approximately 500 nm, approximately 50 nm to approximately 300 nm, or approximately 150 nm. A thickness of the outer gateway layer 234 may be a suitable thickness that enables the outer gateway layer 234 to serve as a gateway for hydrogen gas into the outer gas-permeable layer 232 layer through an outer gas-permeable layer 232/outer gateway layer 234 interface. The thickness of the outer gateway layer 234 generally ranges from approximately 25 nm (nanometers) to approximately 500 nm, approximately 100 nm to approximately 300 nm, or approximately 150 nm.

Figure 4:
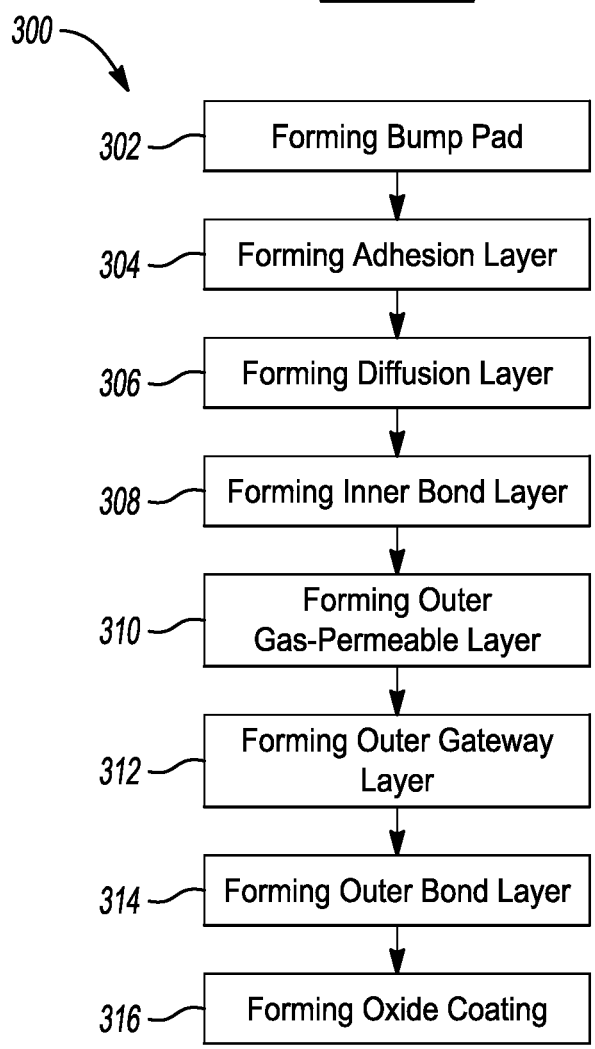
FIG. 4 is a flow diagram of a method of forming the two-bond-layer inter-substrate bond structure in accordance with one or more exemplary embodiments.

Referring to FIG. 4 a flow diagram of an example method 300 of forming the two-bond-layer inter-substrate bond structure 200a is shown in accordance with one or more exemplary embodiments. The method (or process) 300 may be implemented using standard semiconductor fabricating techniques. The method 300 includes steps 302 to 316, as illustrated. The sequence of steps is shown as a representative example. Other step orders may be implemented to meet the criteria of a particular application. While fabrication of a single inter-substrate bond structure 200a (FIG. 3) is shown, an array of many inter-substrate bond structures 200a may be fabricated concurrently.

Referring to FIGS. 3 and 4, in the step 302, the bump pad 212 is formed by depositing and patterning a metal layer on the first insulating layer 146. The adhesion layer 214 is formed on the bump pad 212 in the step 304. The diffusion layer 216 is formed on the adhesion layer 214 in the step 306 by depositing an adhesion metal.

In the step 308, the inner bond layer 218 is formed on the diffusion layer 216 by depositing the bond metal. The outer gas-permeable layer 232 is formed on the inner bond layer 218 in the step 310. The outer gateway layer 234 is formed in the step 312 on the outer gas-permeable layer 232.

In the step 314, the outer bond layer 236 is formed on the outer gateway layer 234 by depositing another bond metal. The outer oxide coating 238 on the outer gas-permeable layer 232 may be formed in the step 316 by exposing the inter-substrate bond structure 200a to oxygen.

Referring to FIG. 5, a schematic side diagram of an example implementation of a first bonded part 290a is shown in accordance with one or more exemplary embodiments. The first bonded part 290a may incorporate the two-bond-layer inter-substrate bond structure 200a.

The first bonded part 290a includes the first substrate 140, the inter-substrate bond structure 200a, and the second substrate 160. The first substrate 140 includes the first side 142, the third side 144, and the inter-substrate bond structure 200a. The second substrate 160 includes a second side 162, a fourth surface 164, a second insulating layer 166, and a mating layer 168. The fourth surface 164 is on an opposite side of the second substrate 160 as the second side 162. The second insulating layer 166 is formed on the second side 162. The mating layer 168 is formed on the second insulating layer 166.

The inter-substrate bond structure 200a is aligned with, and in physical contact with the mating layer 168. The applied pressure 136 and the applied heat 138, provided by the press 102, create an initial thermocompression bond 270a between the inter-substrate bond structure 200a and the mating layer 168. The initial thermocompression bond 270a physically attaches and electrically connects the first substrate 140 to the second substrate 160.

Figure 6:
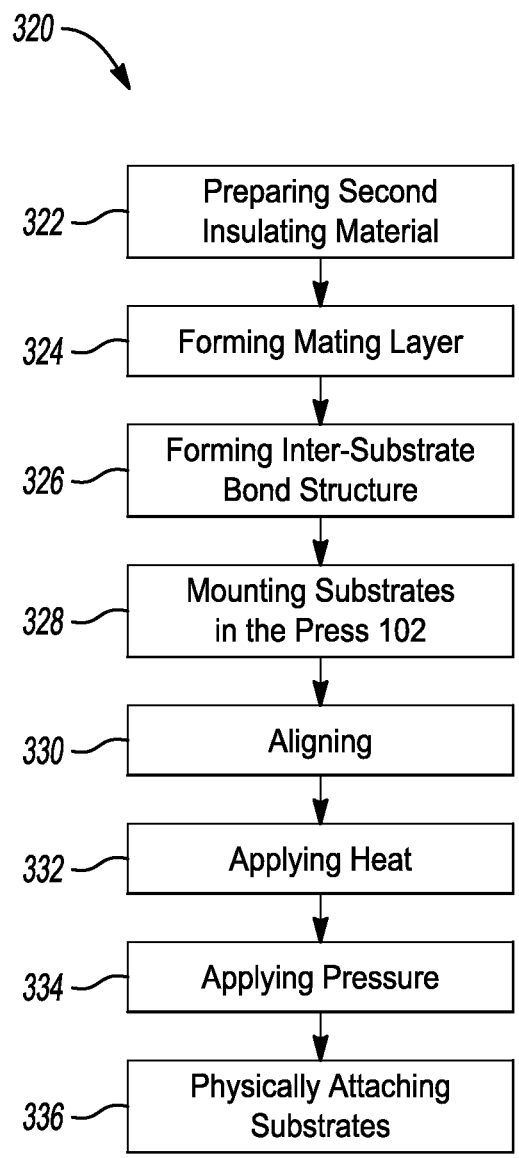
FIG. 6 is a flow diagram of a method to fabricate the first bonded part in accordance with one or more exemplary embodiments.

Referring to FIG. 6, a flow diagram of an example method 320 to fabricate the first bonded part 290a is shown in accordance with one or more exemplary embodiments. The method (or process) 320 may be implemented using standard semiconductor fabricating techniques. The method 320 includes steps 322 to 336, as illustrated. The sequence of steps is shown as a representative example. Other step orders may be implemented to meet the criteria of a particular application.

Referring to FIGS. 1, 5 and 6, in the step 322, the second insulating layer 166 on the second side 162 of second substrate 160 is prepared to receive the mating layer 168. The mating layer 168 is formed on second insulating layer 166 in the step 324. The inter-substrate bond structure 200a may be formed on the first substrate 140 in the step 326 (e.g., the method 300 in FIG. 4).

In the step 328, the first substrate 140 and the second substrate 160 are mounted in the press 102 and aligned in the step 330. The applied heat 138 may be generated in the step 332 to warm the first substrate 140 and the second substrate 160. The applied pressure 136 between the first substrate 140 and the second substrate 160 may be generated in the step 334 to form the initial thermocompression bond 270a. The initial thermocompression bond 270a physically and electrically attaches the first substrate 140 to the second substrate 160 to form the first bonded part 290a in the step 336. The first bonded part 290a is subsequently tested for proper communication between the first substrate 140 and the second substrate 160, and overall operations of the resulting circuitry.

Figure 7:
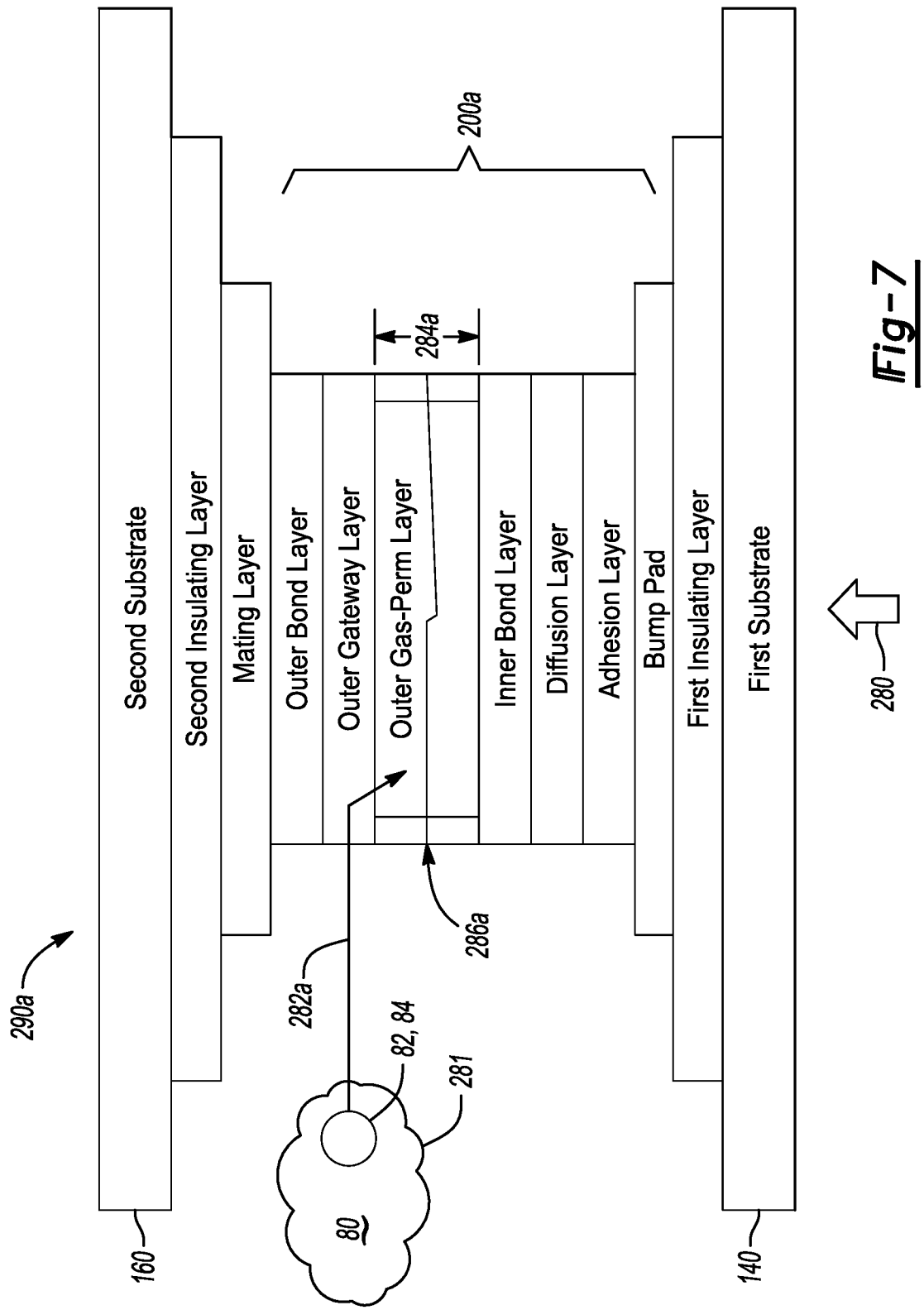
FIG. 7 is a schematic side diagram of the first bonded part being fractured in accordance with one or more exemplary embodiments.

Referring to FIG. 7, a schematic side diagram of an example first bonded part 290a being fractured is shown in accordance with one or more exemplary embodiments. The first bonded part 290a is fractured by exposure to a gas 82 within an atmosphere 80 at a given pressure 281 and heated to a given temperature 280. The gas 82 (e.g., hydrogen 84) diffuses at an outer rate 282a from the atmosphere 80 into the outer gas-permeable layer 232 via the outer gateway layer 234. The gas 82 causes the outer gas-permeable layer 232 to hydrogenate and expand 284a. The expansion 284a causes one or more fractures 286a (or cracks) in the outer gas-permeable layer 232. The fractures 286a permit the first substrate 140 and the second substrate 160 to be physically separated from each other.

Figure 8:
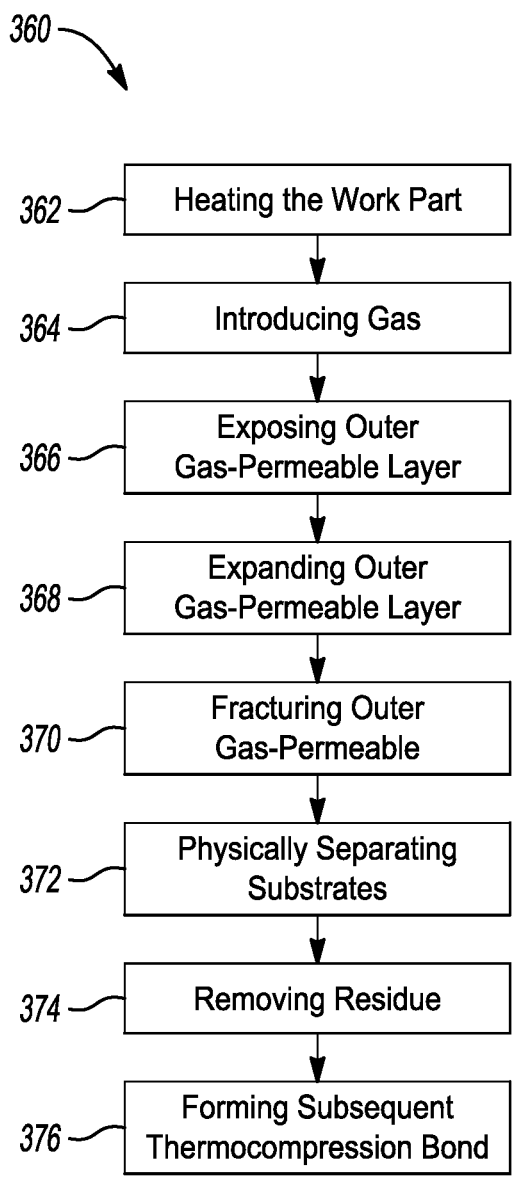
FIG. 8 is a flow diagram of a method for debonding the first bonded part in accordance with one or more exemplary embodiments.

Referring to FIG. 8, a flow diagram of an example method 360 for debonding the first bonded part 290a is shown in accordance with one or more exemplary embodiments. The method (or process) 360 may be carried out using standard semiconductor fabrication techniques. The method 360 includes steps 362 to 376, as illustrated. The sequence of steps is shown as a representative example. Other step orders may be implemented to meet the criteria of a particular application.

Referring to FIGS. 7 and 8, after thermocompression bonding of the first substrate 140 to the second substrate 160, debonding is performed by heating the first bonded part 290a to the given temperature 280 in the step 362. In the step 364, the gas 82 is introduced into the atmosphere 80 around the first bonded part 290a. The inter-substrate bond structure 200a is exposed to the applied pressure 281 of hydrogen 84 for an appropriate amount of time (e.g., 3 to 5 hours) in the step 366, after which the applied pressure 281 of the hydrogen 84 is released. In the step 368, the outer gas-permeable layer 232 expands due to the penetration of the hydrogen 84. The expansion 284a causes fracturing in the inter-substrate bond structure 200a in the step 370. The first substrate 140 and the second substrate 160 are physically (e.g., mechanically) separated in the step 372. Thereafter, the fragments of the inter-substrate bond structure 200a may be removed in the step 374 for reuse in forming a subsequent thermocompression bond in the step 376.

Referring again to FIG. 3, the hydrogen gas is used for the debonding because the hydrogen gas dissociates on the exposed edges of the palladium in the outer gateway layer 234, and atomic hydrogen diffuses throughout the palladium forming a metallic palladium-hydride phase. At the titanium/palladium interface, the palladium provides a gateway for hydrogen into the titanium of the outer gas-permeable layer 232. Thus, the hydrogen diffuses from the palladium into the titanium and hydrogenates the titanium forming an insulating $TiH_2$ phase. The atomic level lattice expansion that occurs upon formation of the $TiH_2$ results in stresses that fracture the $TiH_2$ layer and/or the interfaces with the overlying palladium and/or the underlying bond metal in the inner bond layer 218. In addition, the lateral expansion that occurs in the palladium upon metallic palladium-hydride formation may result in stresses that fracture the palladium/outer bond layer interface. Together, the fractures enable separation of the bonded substrates 140 and 160. Selective etching removes residual titanium and/or $TiH_2$, leaving the initially underlying inner bond layer 218 exposed with a clean surface that may be thermocompression bonded in a subsequent cycle. Inter-substrate bond structures containing multiple titanium alloy/palladium/bond metal layers each with a different titanium alloy, with different hydrogenation pressures, may be used to enable multiple bonding/debonding cycles.

Figure 9:
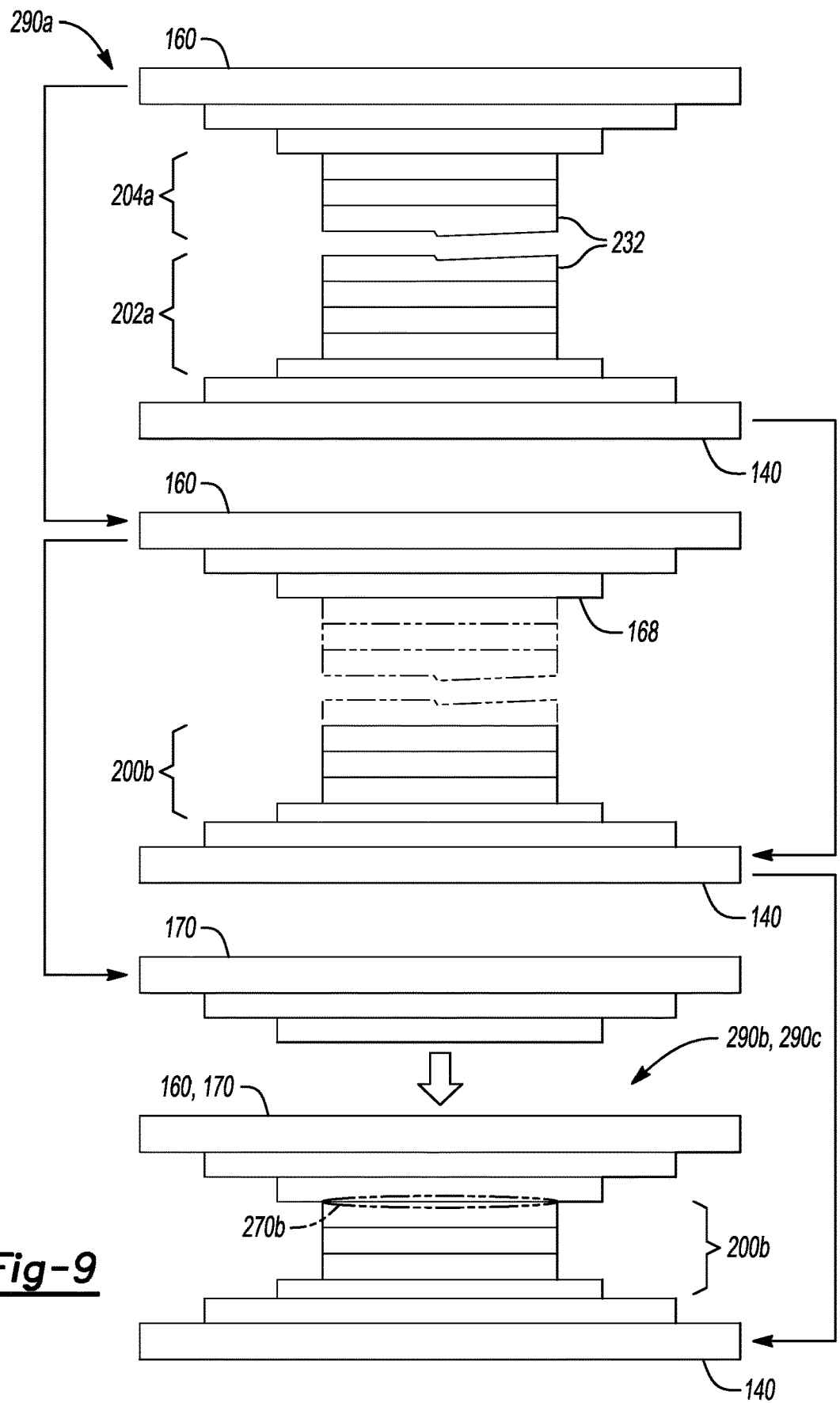
FIG. 9 is a schematic diagram illustrating a rework of the first bonded part into a second bonded part or a third bonded part in accordance with one or more exemplary embodiments.

Referring to FIG. 9, a schematic diagram illustrating an example rework of the first bonded part 290a into a second bonded part 290b or a third bonded part 290c is shown in accordance with one or more exemplary embodiments. After fracturing (top of the figure), the inter-substrate bonding structure 200a (FIG. 7) may be divided into a first portion 202a and a second portion 204a. In the example, the inter-substrate bond structure 200a is broken within the outer gas-permeable layer 232. The first portion 202a remains attached to the first substrate 140. The second portion 204a remains attached to the second substrate 160.

The first portion 202a may include residual $TiH_2$ and/or unreacted titanium that are removed by selective etches, such as Transene Titanium Etchants TFT or TFTN (center of the figure). The etching leaves a shortened inter-substrate bond structure 200b with a clean inner bond layer suitable for a subsequent cycle of bonding. The residue on the second substrate 160 may also be etched to leave a clean mating layer 168.

In various embodiments, the cleaned first substrate 140 and the cleaned second substrate 160 may be rebonded with a subsequent thermocompression bond 270b to create a second bonded part 290b with the shortened inter-substrate bond structure 200b (bottom of the figure). In other embodiments, a third substrate 170 may be bonded to the cleaned first substrate 140 with the subsequent thermocompression bond 270b to create a third bonded part 290c also with the shortened inter-substrate bond structure 200b.

Figure 10:
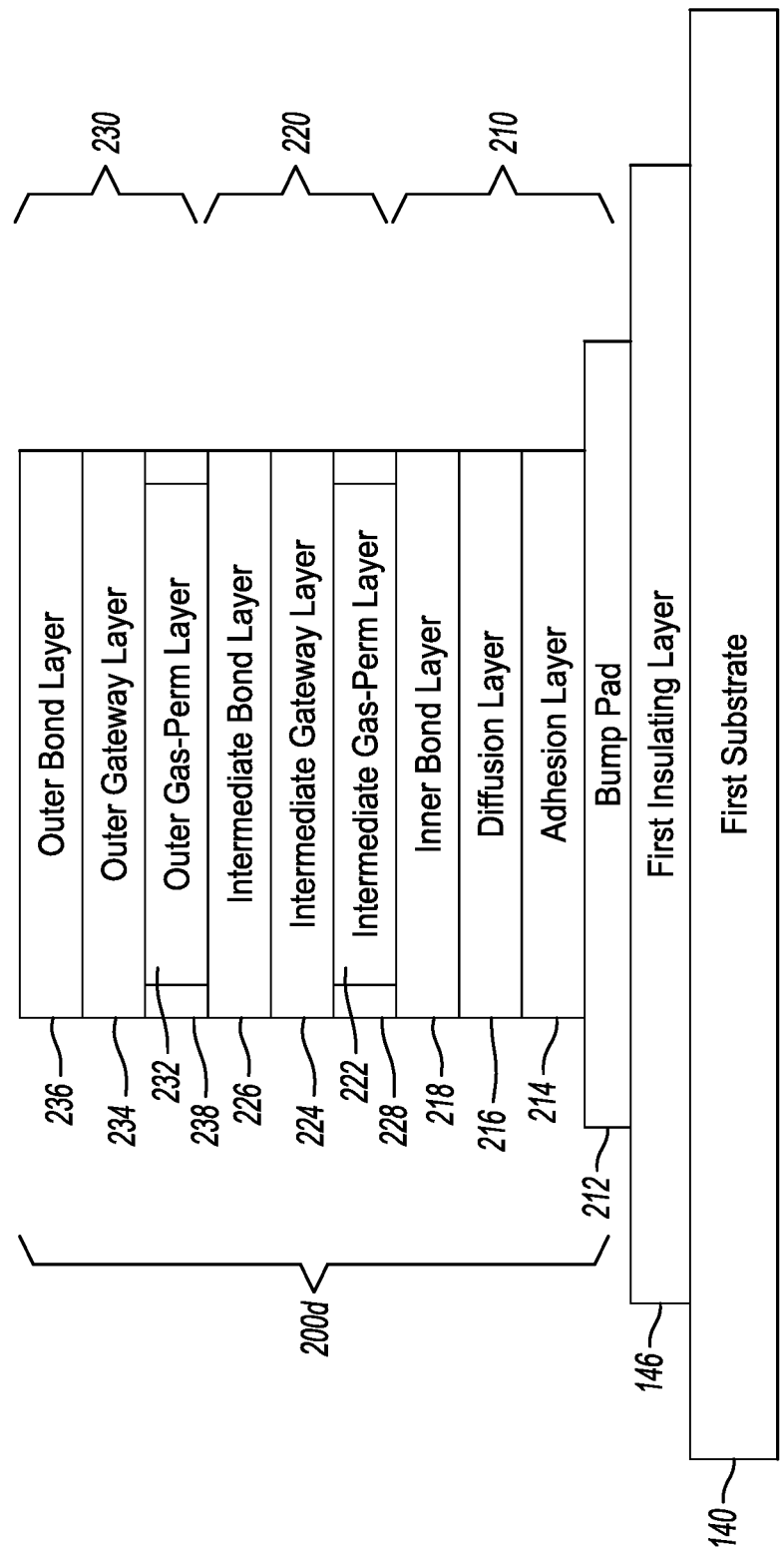
FIG. 10 is a schematic side diagram of an inter-substrate bond structure with three sets of bond layers in accordance with one or more exemplary embodiments.

Referring to FIG. 10, a schematic side diagram of an example implementation of an inter-substrate bond structure with three sets of bond layers is shown in accordance with one or more exemplary embodiments. The inter-substrate bond structure 200d illustrates a reversible contact that may be used three times. The inter-substrate bond structure 200d is formed on the first substrate 140. The inter-substrate bond structure 200d includes the inner structure 210, an intermediate structure 220, and the outer structure 230.

The inner structure 210 and the outer structure 230 are the same as shown in FIG. 3. The intermediate structure 220 is similar to the outer structure 230, but is disposed between the inner structure 210 and the outer structure 230. The intermediate structure 220 includes an intermediate gas-permeable layer 222, an intermediate gateway layer 224, an intermediate bond layer 226, and an intermediate oxide coating 228.

The intermediate gas-permeable layer 222 is formed on the inner bond layer 218 and is similar to the outer gas-permeable layer 232. The intermediate gas-permeable layer 222 is generally fabricated with an alloy that absorbs the hydrogen gas at a slower rate than the outer gas-permeable layer 232.

The intermediate gateway layer 224 is formed on the intermediate gas-permeable layer 222 and is similar to the outer gateway layer 234.

The intermediate bond layer 226 is formed on the intermediate gateway layer 224 and is similar to the outer bond layer 236.

The intermediate oxide coating 228 is formed on an exterior surface of the intermediate gas-permeable layer 222, and is similar to the outer oxide coating 238 on the outer gas-permeable layer 232.

Figure 11:
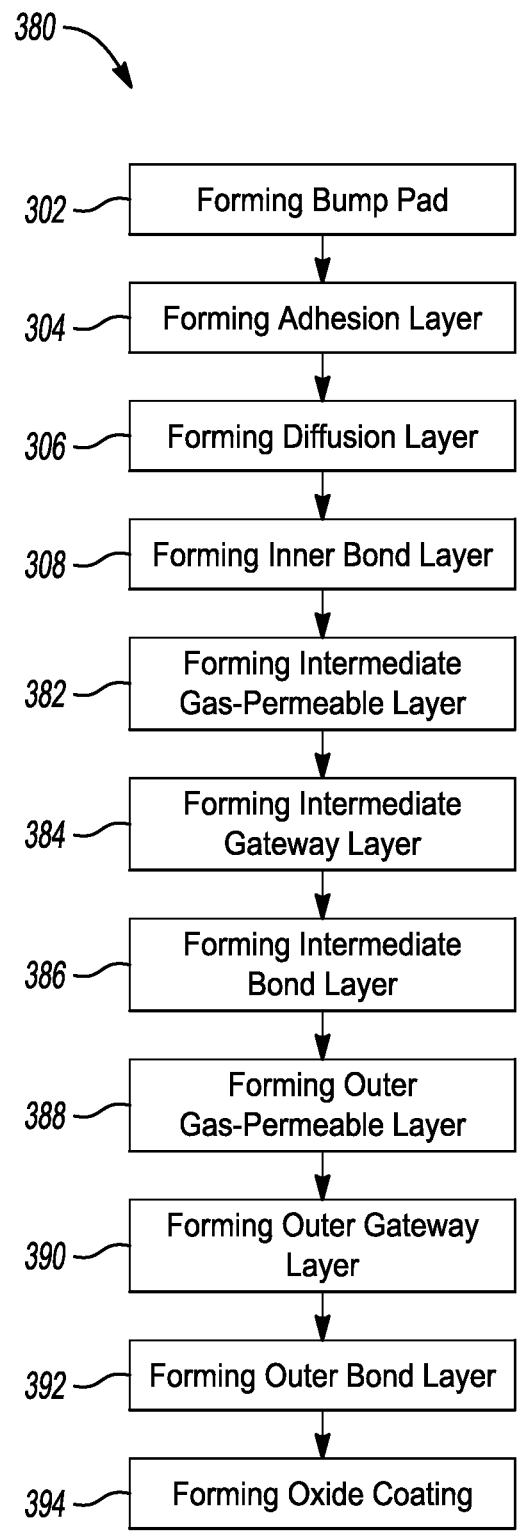
FIG. 11 is a flow diagram of a method of forming the three-bond-layer inter-substrate bond structure in accordance with one or more exemplary embodiments

Referring to FIG. 11, a flow diagram of an example method 380 of forming the three-bond-layer inter-substrate bond structure 200d is shown in accordance with one or more exemplary embodiments. The method (or process) 380 may be implemented using standard semiconductor fabricating techniques. The method 380 includes steps 302 to 308 and 382 to 394, as illustrated. The sequence of steps is shown as a representative example. Other step orders may be implemented to meet the criteria of a particular application.

While fabrication of a single inter-substrate bond structure 200d is shown, an array of many inter-substrate bond structures 200d may be fabricated concurrently.

Referring to FIGS. 10 and 11, in the step 302, the bump pad 212 is formed by depositing and patterning a metal layer on the first insulating layer 146. The adhesion layer 214 is formed on the bump pad 212 in the step 304. The diffusion layer 216 is formed on the adhesion layer 214 in the step 306 by depositing an adhesion metal. In the step 308, the inner bond layer 218 is formed on the diffusion layer 216 by depositing the bond metal.

The intermediate gas-permeable layer 222 is formed on the inner bond layer 218 in the step 382. The intermediate gateway layer 224 is formed in the step 384 on the intermediate gas-permeable layer 222. In the step 386, the intermediate bond layer 226 is formed on the intermediate gateway layer 224 by depositing another bond metal.

In the step 388, the outer gas-permeable layer 232 is formed on the intermediate bond layer 226. The outer gateway layer 234 is formed on the outer gas-permeable layer 232 in the step 390. In the step 392, the outer bond layer 236 is formed on the outer gateway layer 234. The intermediate oxide coating 228 on the intermediate gas-permeable layer 222, and the outer oxide coating 238 on the outer gas-permeable layer 232 may be formed in the step 394 by exposing the inter-substrate bond structure 200d to oxygen.

Figure 12:
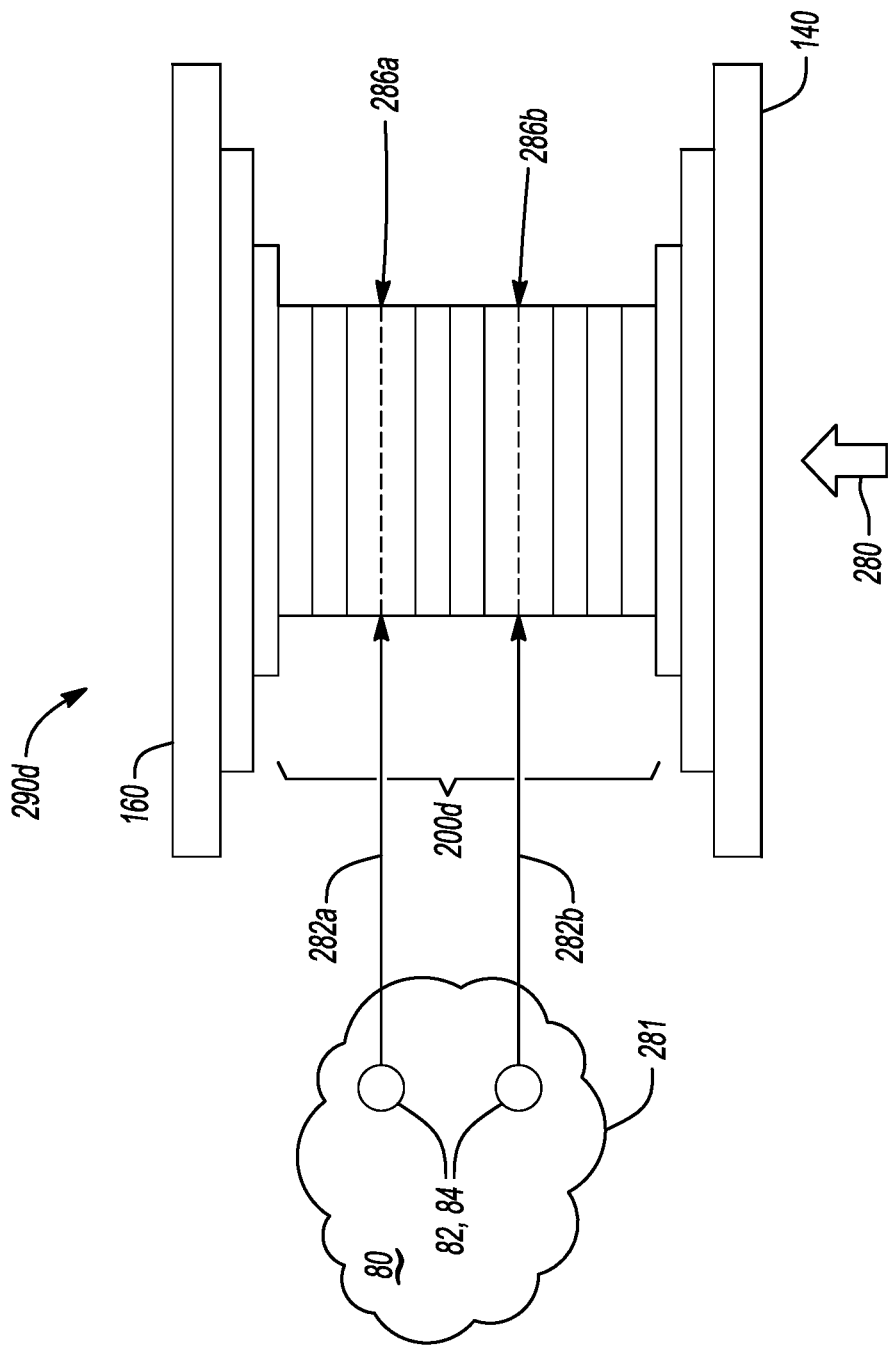
FIG. 12 is a schematic side diagram of a fourth bonded part being fractured in accordance with one or more exemplary embodiments.

Referring to FIG. 12, a schematic side diagram of an example fourth bonded part 290d being fractured is shown in accordance with one or more exemplary embodiments. The fourth bonded part 290d is fractured by exposure to the gas 82 within the atmosphere 80 at the given pressure 281 and heated to the given temperature 280. The gas 82 diffuses from the atmosphere 80 into the outer gas-permeable layer 232 (FIG. 10) via the outer gateway layer 234 at an outer rate 282a, and into the intermediate gas-permeable layer 222 via the intermediate gateway layer 224 at an intermediate rate 282b. The intermediate rate 282b is slower than the outer rate 282a. The gas 82 causes the outer gas-permeable layer 232 to hydrogenate and expand. The expansion of the outer gas-permeable layer 232 causes one or more fractures 286a (or cracks) in the outer gas-permeable layer 232. The fractures 286a permit the first substrate 140 and the second substrate 160 to be physically separated from each other. The gas 82 also causes the intermediate gas-permeable layer 222 to hydrogenate, but at a slower rate than the outer gas-permeable layer 232. Therefore, the intermediate gas-permeable layer 222 has not fractured 286b at the point where the outer gas-permeable layer 232 has fractured 286a.

Use of a titanium/palladium bilayer between the two bond layers in the two-bond-layer inter-substrate bond structure 200a (FIG. 3) enables a single cycle of debonding. Two or more cycles of debonding may be achieved with bond pad structures containing multiple titanium alloy/palladium bilayers where the final bilayer contains titanium metal, and the earlier bilayers contain titanium alloys with increasing equilibrium hydrogenation pressures. Varying the alloys in the gas-permeable layers enables the outer gas-permeable bilayer to fracture and the overlying second substrate 160 to be debonded at a low hydrogen pressure, while lower gas-permeable layers remain in metallic and electrically conducting states. After rebonding the second substrate 160 or bonding with the third substrate 170, exposure to higher hydrogen pressures may be used hydrogenate and fracture the next lower (e.g., next closer to the first substrate 140) titanium alloy/palladium bilayer in a subsequent cycle.

The titanium metal hydrogenates at low pressures at a near room temperature. Therefore, a moderate predetermined hydrogen pressure of approximately 1 atmosphere is sufficient for formation of the $TiH_2$. For higher equilibrium hydrogen pressures, the titanium alloys may be used. For example, alloys of vanadium, titanium, and chromium form approximately stoichiometric hydrides with equilibrium hydrogen pressures that vary continuously with composition. In particular, hydrogen absorption at 273 Kelvin (K) (0° C.) occurs at 0.5 atmospheres for $V_{0.80}Ti_{0.08}Cr_{0.12}$, at 3 atmospheres for $V_{0.80}Ti_{0.05}Cr_{0.15}$, and at 10 atmospheres for $V_{0.80}Ti_{0.03}Cr_{0.17}$. Adjusting to room temperature (approximately 22° C., and an increase in pressure of approximately 2.5×) gives estimated hydrogenation pressures of 1.25 atmospheres for $V_{0.80}Ti_{0.05}Cr_{0.12}$, at 7.5 atmospheres for $V_{0.80}Ti_{0.05}Cr_{0.15}$, and at 25 atmospheres for $V_{0.80}Ti_{0.03}Cr_{0.17}$. Thus, using a layered bond structure, such as base-layers/Au/$V_{0.80}Ti_{0.03}Cr_{0.17}$/Pd/Au/$V_{0.80}Ti_{0.05}Cr_{0.15}$/Pd/Au/Ti/Pd/Au, may be bonded three times reversibly and a fourth final time. After a first bonding to the top gold layer, a hydrogen pressure of approximately 1 atmosphere would hydrogenate the titanium layer, but be too low to hydrogenate either of the underlying titanium alloy layers. After an initial removal of the second substrate 160 and a second bonding, a pressure of 10 atmospheres would hydrogenate the $V_{0.80}Ti_{0.05}Cr_{0.15}$ layer but be too low to hydrogenate the $V_{0.80}Ti_{0.03}Cr_{0.17}$ layer. After another removal of the mated substrate and a third bonding, a pressure of 30 atmospheres would hydrogenate the $V_{0.80}Ti_{0.03}Cr_{0.17}$ layer enabling a third debonding and a fourth and final bonding. Although pressures from 1 to 30 atmospheres may be applied, finer compositional variations may be used to reduce the range of applied pressures.

Figure 13:
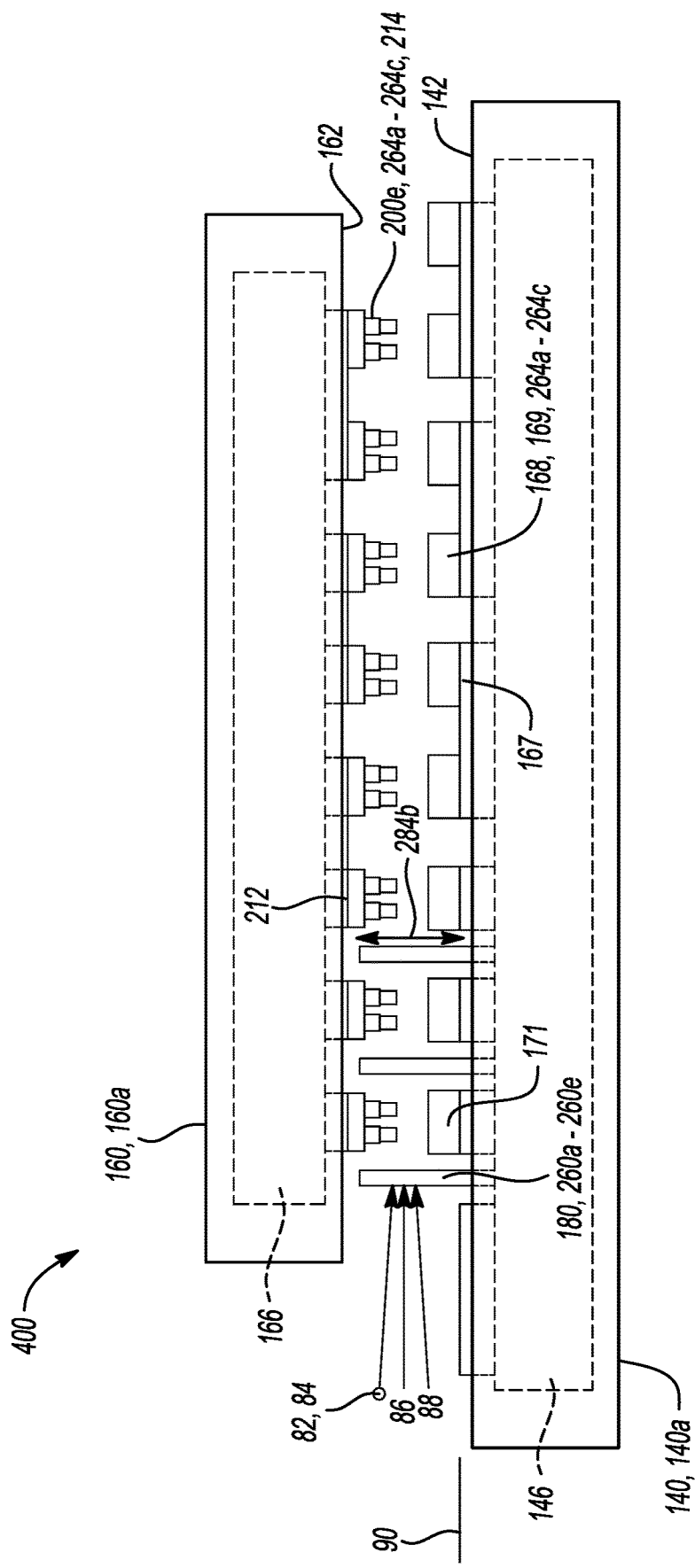
FIG. 13 is a schematic cross-sectional diagram of a reversable attachment system accordance with one or more exemplary embodiments.

Referring to FIG. 13, a schematic cross-sectional diagram of an example implementation of a reversable attachment system 400 shown in accordance with one or more exemplary embodiments. The reversable attachment system 400 illustrates a reversible contacts that may be reusable. The reversable attachment system 400 includes multiple inter-substrate bond structures 200e formed on a second substrate 160a and mated to a first substrate 140a. The first substrate 140a is a variation of the first substrate 140. The second substrate 160a is a variation of the second substrate 160. The inter-substrate bond structures 200e are a variation of the inter-substrate bond structures 200a-200d. In the example illustrated, the inter-substrate bond structures 200e may be formed on the second substrate 160a, rather than the first substrate 140, as shown in FIG. 5. The mating layer 168 may be formed in the first substrate 140a, rather than the second substrate 160, as shown in FIG. 5. The mating layer 168 may be patterned into multiple mating pads 169.

Regarding the first substrate 140a, a fanout conductive layer 167 is disposed on the first insulating layer 146. The fanout conductive layer 167 forms signal traces and power traces. The mating pads 169 are formed on the fanout conductive layer 167. Multiple extension actuators 180 are formed on the first substrate 140a. The extension actuators 180 are designed (and fabricated) to create strains for debonding by locating the extension actuators 180 at the periphery or in interstitial positions within the fine-pitch arrays.

Regarding the second substrate 160a, the bump pads 212 are formed on the second insulating layer 166. The adhesion layer 214 is formed on the bump pads 212. The inter-substrate bond structures 200e is formed on the adhesion layer 214.

A height of the extension actuators 180 approximately matches, or is slightly shorter, than combined height of the mating layer 168 and the inter-substrate bond structures 200e. As such, while the first substrate 140a is bonded to the second substrate 160a, the extension actuators 180 are touching or near the second side 162 of the second substrate 160a. Touching or nearly touching generally provides a greatest amount of actuator elongation action on the surfaces of the first substrate 140a and the second substrate 160a. The heights of inter-substrate bond structures 200e and the extension actuators 180 are designed to allow bonding of the electrical interconnects using thermocompression bonding. The heights of the various layers may be controlled by an e-beam deposition process, together with post-deposition inspection by a scanning-electron microscope. To facilitate the debonding process, a low bond strength metal coating (e.g., a platinum layer) may be applied to dummy pads 171 (e.g., pads not used for inter-substrate electrical signals or power) to provide a lower overall bond strength. The dummy pads 171 may be outside an electrically active interconnect region.

In various embodiments, the first substrate 140a and the second substrate 160a may be reversed such that the inter-substrate bond structures 200e are formed on the first substate 140a and the mating pads 169 are formed on the second substrate 160a. In some embodiments, the extension actuators 180 may be fabricated on the second substrate 160a.

The inter-substrate bond structures 200e implement bumps or spikes. Each inter-substrate bond structure 200e may be fabricated as solid gold 264a, copper 264b, or aluminum 264c. Other conductive metal layers may be used to meet the design criteria of a particular application. An optional overcoat layer may be added to the inter-substrate bond structures 200e. The mating pads 169 may also be fabricated with gold 264a, copper 264b, or aluminum 264c.

The extension actuators 180 may be fabricated with titanium 260a, titanium alloy 260b, vanadium 260c, niobium 260d, or palladium 260e. The extension actuators 180 are positioned either externally or tightly integrated within the fine-pitch integrated circuit interconnect footprint. A medium of the extension actuators 180 are metals (and/or their alloys) that absorb the gas 82 (e.g., hydrogen 84) and whose out-of-plane (e.g., perpendicular to a plane 90 defined by the first side 142 of the first substrate 140a) linear expansion 284b is used to apply forces to the facing surfaces of the first substrate 140a and the second substrate 160a. The extension actuators 180 generally remain responsive to the gas 82 after exposure to one or more semiconductor processing chemicals 86 (e.g., photoresists, developers, image reverse gases, and solvents cleaners) used in fabrication of the extension actuators 180. When the gas 82 is removed, the extension actuators 180 expel the gas 82 and shrink to an original size. Once fabrication and/or rework is complete, a blocking chemical 88 (e.g., sulfur containing compounds) may be used to inhibit the extension actuators 180 from absorbing the gas 82 by poisoning the exposed surfaces of the extension actuators 180.

Palladium 260e and other metals (e.g., Ti, V, Nb) that reversibly absorb hydrogen 84 at room temperature are used to fabricate the extension actuator 180 microstructures. For example, palladium 260e absorbs the hydrogen 84 at room temperature and a low pressures (<<1 atm) enabling reversible expansion by absorbing up to 900 times its own volume. Hydrogen absorption extends a lattice of the face-centered cubic crystal structure palladium crystal by up to 3.3% linearly resulting in strains sufficient to detach the first substrate 140a from the second substrate 160a.

The absorption of the hydrogen 84 by the palladium 260e proceeds through two palladium hydride phases (a and B), depending on the hydrogen overpressure and temperature, whose lattices provide 0.2% and 3.3% linear expansion, respectively. The strain produced from the B phase, where engineered properly exceeds the yielding limits of bond metals (e.g., Au, Al, Cu) used to integrate the first substrate 140a to the second substrate 160a, and provides an integrated approach for microelectronic component detachment.

From a manufacturing prospective, palladium as well as other hydrogen absorbing metals (e.g., Ti, V, Nb) are currently used in semiconductor manufacturing process and may be fabricated into the extension actuators 180 using standard processes (e.g., deposition, evaporation, sputtering, plating, photolithography, and plasma etching) and are compatible with existing fine-pitch bond metal processes.

Figure 14:
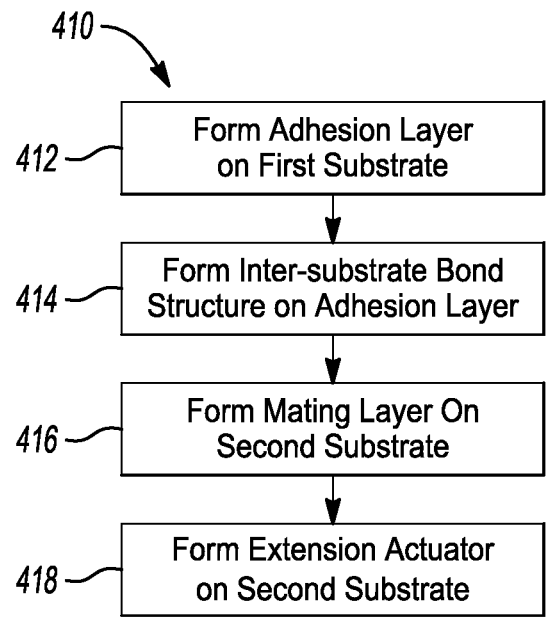
FIG. 14 is a flow diagram of a method for fabricating a reversable attachment system in accordance with one or more exemplary embodiments.

Referring to FIG. 14, a flow diagram of an example method 410 for fabricating a reversable attachment system is shown in accordance with one or more exemplary embodiments. The method (or process) 410 may be implemented using standard semiconductor fabricating techniques. The method 410 includes steps 412 to 418, as illustrated. The sequence of steps is shown as a representative example. Other step orders may be implemented to meet the criteria of a particular application.

Referring to FIG. 14 and FIG. 13, in the step 412, the adhesion layer 214 may be formed and patterned on the first substrate 140a. The inter-substrate bond structures 200e are formed on the adhesion layer 214 in the step 414. The mating layer 168 is formed and patterned into the mating pads 169 in the step 416 on the second substrate 160a. In the step 418, the extension actuators 180 are formed on the second substrate 160a.

Figure 15:
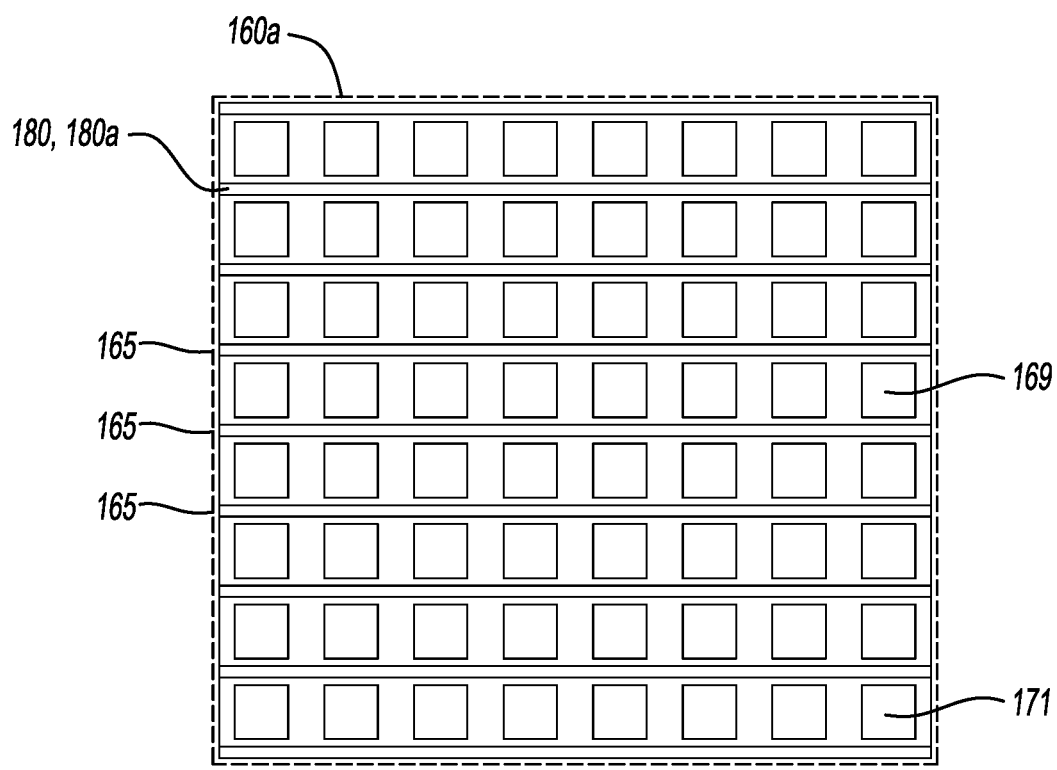
FIG. 15 is a schematic plan diagram of a second substrate in accordance with one or more exemplary embodiments.

Referring to FIG. 15, a schematic plan diagram of an example second substrate 160a is shown in accordance with one or more exemplary embodiments. The second substrate 160a includes the mating pads 169, the dummy pads 171, and multiple extension actuators 180. In various embodiments, the extension actuators 180 form bars 180a. The bars 180a are aligned between the mating pads 169 and the dummy pads 171.

A finite element analysis model was constructed to predict the stress/strain behavior of the extension actuators 180. Specifically, the extension actuators 180 were modeled as palladium bar structures arranged (or running) between the rows 165 of gold mating pads 169, and with a 3.3% linear extension for the palladium actuator strain. Under such conditions, the palladium bars exceed the ultimate strength of the gold-to-gold interconnect bonds (at 0.7% strain for gold). Thus, the palladium actuator bars provide sufficient stress for gold-to-gold bonding array detachment.

Figure 16:
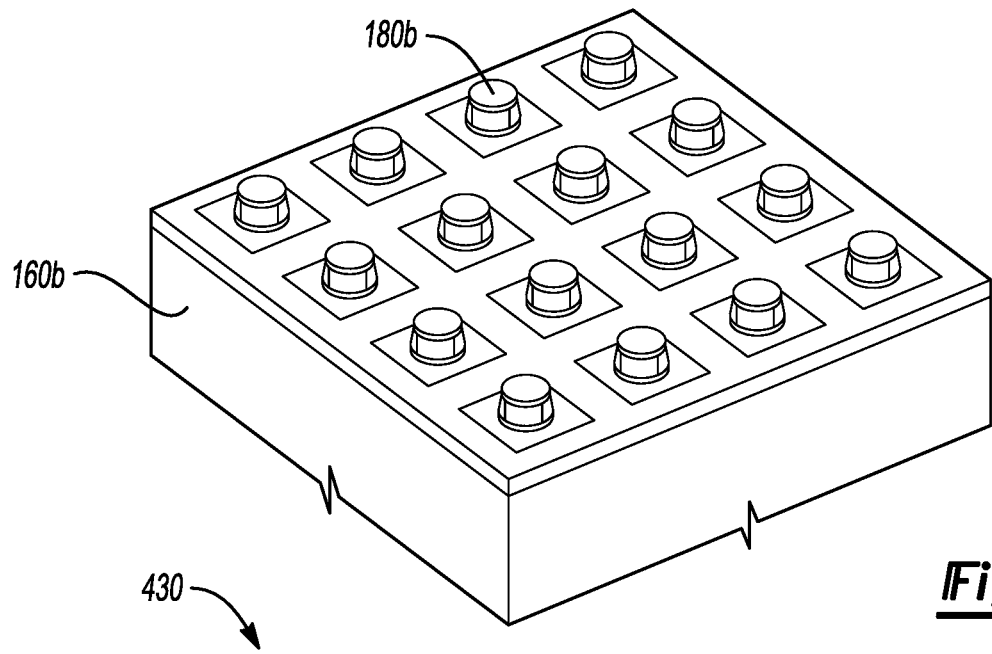
FIG. 16 is a schematic perspective diagram of another second substrate in accordance with one or more exemplary embodiments.

Referring to FIG. 16, a schematic perspective diagram of an example second substrate 160b is shown in accordance with one or more exemplary embodiments. The second substrate 160b may be a variation of the second substrate 160a. The second substrate 160b includes multiple extension actuators 180b. The extension actuators 180b are variations of the extension actuators 180. The extension actuator 180b are disposed across the second side 162 of the second substrate 160b.

Figure 17:
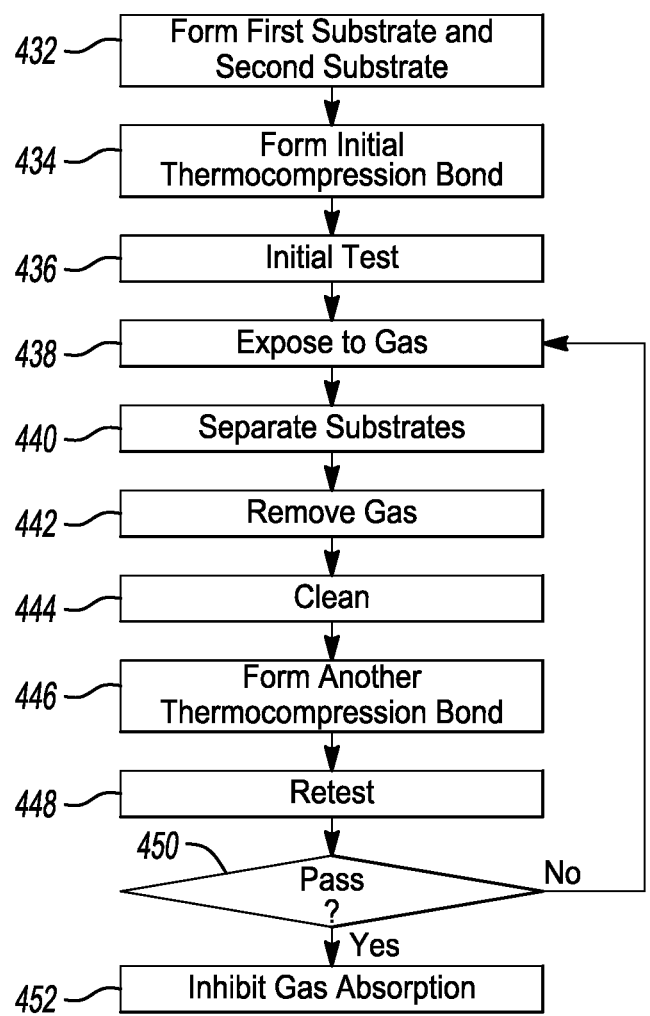
FIG. 17 is a flow diagram of a method for reworking an inter-substrate thermocompression bond in accordance with one or more exemplary embodiments

Referring to FIG. 17, a flow diagram of an example method 430 for reworking an inter-substrate thermocompression bond is shown in accordance with one or more exemplary embodiments. The method (or process) 430 may be implemented using standard semiconductor fabricating techniques. The method 430 includes steps 432 to 452, as illustrated. The sequence of steps is shown as a representative example. Other step orders may be implemented to meet the criteria of a particular application.

Referring to FIG. 17 and FIG. 13, in the step 432 the first substrate 140a and the second substrate 160a are formed per the method 410. The first substrate 140a and the second substrate 160a are bonded to each other in the step 434 using an initial thermocompression bonding technique. An initial test of the resulting reversable attachment system 400 is performed in the step 436. If the initial test passes, the method 430 proceeds with the step 452 to inhibit a future expansion of the extension actuators 180. If the initial test fails, the reversable attachment system 400 is exposed to the gas 82 in the step 438. The gas 82 causes the extension actuators 180 to linearly expand thereby stressing the initial thermocompression bonds. In the step 440, the first substrate 140a and the second substrate 160a may be separated. The gas 82 may subsequently be removed in the step 442.

In the step 444, the first substrate 140a and, optionally, the second substrate 160a are cleaned. The first substrate 140a is re-bonded to the second substrate 160a or a third substrate (e.g., the third substrate 170 in FIG. 9) with another thermocompression bond applying additional applied pressure 136 and additional applied heat 138 (see FIG. 1) in the step 446.

The reworked reversable attachment system 400 is retested in the step 448. If the test fails per the step 450, the method 430 may return to the step 438 to weaken the thermocompression bonds again. Once the test or retest passes per the step 450, the reversable attachment system 400 is exposed to the blocking chemical 88 in the step 452 to inhibit future absorption of the gas 82.

Implementing tilt corrections on the press 102 allowed the fine-pitch arrays to bond within the specification (e.g., 60 microradian). The tilt-corrected bonding allow the palladium bar extension actuators 180 to extend and apply force between the second substrate 160a and the first substrate 140a during hydrogen absorption.

Sets of samples were bonded and exposed to hydrogen 84 using the layouts shown in FIG. 13. Daisy chain resistance data was measured from these substrate pairs (6 μm×6 μm) after bonding. Infrared microscope inspection often showed some misalignment of the tightly integrated extension actuators 180 in the lanes of the daisy chains. Initial experiments for debonding using the well-aligned samples were conducted while measuring the resistance of the daisy chains during the exposed to hydrogen 84. To accomplish this, the daisy-chain test chips were mounted on a printed circuit board and wire bonded to a fanout that was routed to a cable connector. The resistance of the daisy chains was subsequently monitored with a digital volt meter through a vacuum feed-thru as the sample held in the exposure (vacuum) chamber. The chamber was pumped down (milli-Torr range) and then exposed to 1 atmosphere (760 Torr) of hydrogen 84. The resistance of the daisy-chains consistently increased from baseline levels (pre-exposure levels) to open circuit values (>10 megaohms).

Embodiments of the disclosure generally provide an expansion actuator structure located between two thermocompression bonded substrates that expands to exert a force on the surfaces of the bonded substrates with sufficient magnitude to debond the thermocompression bonded substrates. The expansion actuator structures are made with metals that absorb hydrogen and expand in the out-of-plane direction. The extension actuators remain active after exposure to semiconductor processing chemical used to fabricate circuitry on the substrates. The extension actuators may be inhibited from absorbing the hydrogen by exposure to blocking chemicals (e.g., sulfur containing compounds, alkyl thiols). The resulting technique provides a temporary attachment/detachment process that allows multiple bonding/debonding cycles.

This disclosure is susceptible of embodiments in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. A reversable attachment system comprising:
   an adhesion layer configured to attach to a first substrate;
   an inter-substrate bond structure coupled to the adhesion layer;
   a mating layer configured to attach to a second substrate; and
   an extension actuator configured to attach to the second substrate and expand in response to an absorption of a gas,
   wherein the inter-substrate bond structure is configured to form an initial thermocompression bond with the mating layer in response to an applied pressure and an applied heat, and the expansion of the extension actuator in response to absorbing the gas detaches the inter-substrate bond structure from the mating layer.

2. The reversable attachment system according to claim 1, wherein the first substrate defines a plane, and the expansion is perpendicular to the plane.

3. The reversable attachment system according to claim 1, wherein the extension actuator remains responsive to the gas after exposure to one or more semiconductor processing chemicals used in fabrication of the extension actuator.

4. The reversable attachment system according to claim 1, further comprising:
a blocking chemical configured to inhibit the extension actuator from absorbing the gas.

5. The reversable attachment system according to claim 1, further comprising:
a plurality of the inter-substrate bond structures arranged in a plurality of rows; and
a plurality of the extension actuators disposed between the rows.

6. The reversable attachment system according to claim 5, wherein the plurality of the extension actuators are configured as a plurality of bars between the rows.

7. The reversable attachment system according to claim 1, wherein the inter-substrate bond structure comprises:
an outer gas-permeable layer coupled to the adhesion layer, wherein the outer gas-permeable layer is configured to expand and create a fracture in the inter-substrate bond structure in response to another absorption of the gas; and
an outer bond layer coupled to the outer gas-permeable layer, wherein the outer bond layer is configured to form the initial thermocompression bond with the mating layer on the second substrate.

8. The reversable attachment system according to claim 1, wherein:
the extension actuator comprises one of palladium, vanadium, niobium, and titanium; and
the gas comprises hydrogen.

9. The reversable attachment system according to claim 1, wherein the first substrate comprises one of a semiconductor die, a semiconductor tile, or a semiconductor wafer.

10. A method for fabricating a reversable attachment system comprising:
forming an adhesion layer on a first substrate;
forming an inter-substrate bond structure on the adhesion layer;
forming a mating layer on a second substrate; and
forming an extension actuator on the second substrate, wherein the extension actuator is configured to expand in response to an absorption of a gas;
wherein the inter-substrate bond structure is configured to form an initial thermocompression bond with the mating layer in response to an applied pressure and an applied heat, and the expansion of the extension actuator in response to absorbing the gas detaches the inter-substrate bond structure from the mating layer.

11. The method according to claim 10, wherein the first substrate defines a plane, and the expansion is perpendicular to the plane.

12. The method according to claim 10, wherein the extension actuator remains responsive to the gas after exposure to one or more semiconductor processing chemicals used in fabrication of the extension actuator.

13. The method according to claim 10, further comprising:
inhibiting the extension actuator from absorbing the gas with a blocking chemical.

14. The method according to claim 10, further comprising:
forming a plurality of the inter-substrate bond structures arranged in a plurality of rows; and
forming a plurality of the extension actuators between the rows.

15. The method according to claim 14, wherein the plurality of the extension actuators are configured as a plurality of bars between the rows.

16. The method according to claim 10, further comprising:
forming an outer gas-permeable layer of the inter-substrate bond structure, wherein the outer gas-permeable layer is coupled to the adhesion layer, and the outer gas-permeable layer is configured to expand and create a fracture in the inter-substrate bond structure in response to another absorption of the gas; and
forming an outer bond layer of the inter-substrate bond structure, wherein the outer bond layer is coupled to the outer gas-permeable layer, and the outer bond layer is configured to form the initial thermocompression bond with the mating layer on the second substrate.

17. The method according to claim 10, wherein:
the extension actuator comprises one of palladium, vanadium, niobium, and titanium; and
the gas comprises hydrogen.

18. A method of reworking an inter-substrate thermocompression bond, comprising:
forming an adhesion layer on a first substrate;
forming an inter-substrate bond structure on the adhesion layer;
forming a mating layer on a second substrate;
forming an extension actuator on the second substrate, wherein the extension actuator is configured to expand in response to an absorption of a gas;
forming an initial thermocompression bond between the inter-substrate bond structure on the first substrate and the mating layer on the second substrate in response to an applied pressure and an applied heat;
exposing the extension actuator to the gas, wherein the expansion of the extension actuator in response to absorbing the gas detaches the inter-substrate bond structure from the mating layer; and
separating the first substrate from the second substrate.

19. The method according to claim 18, further comprising:
removing the gas from the extension actuator, wherein the extension actuator returns to an original size in response to the removing of the gas; and
forming another thermocompression bond between the inter-substrate bond structure on the first substrate and the mating layer on the second substrate in response to an additional applied pressure and an additional applied heat.

20. The method according to claim 18, further comprising:
forming another thermocompression bond between another inter-substrate bond structure on a third substrate and the mating layer on the second substrate in response to an additional applied pressure and an additional applied heat.

* * * * *